United States Patent
Kim et al.

(10) Patent No.: US 9,748,512 B2
(45) Date of Patent: Aug. 29, 2017

(54) SEE-THROUGH ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: Hyoungsu Kim, Anyang-si (KR); Namwook Cho, Paju-si (KR); Jaehee Park, Gumi-si (KR); Euitae Kim, Paju-si (KR); Buyeol Lee, Goyang-si (KR); Hyuntaek Lim, Busan (KR); Junbae Son, Seoul (KR); Myungjae Yoo, Busan (KR); Jaemyon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/919,580

(22) Filed: Oct. 21, 2015

(65) Prior Publication Data

US 2016/0149156 A1    May 26, 2016

(30) Foreign Application Priority Data

Nov. 25, 2014  (KR) .......................... 10-2014-0165087
Nov. 25, 2014  (KR) .......................... 10-2014-0165538
Dec. 2, 2014   (KR) .......................... 10-2014-0170476
Apr. 30, 2015  (KR) .......................... 10-2015-0061510

(51) Int. Cl.
| H01L 33/00 | (2010.01) |
| H01L 51/52 | (2006.01) |
| H01L 51/00 | (2006.01) |
| H01L 27/32 | (2006.01) |

(52) U.S. Cl.
CPC ........ *H01L 51/5228* (2013.01); *H01L 27/326* (2013.01); *H01L 27/3246* (2013.01); *H01L 51/0097* (2013.01); *H01L 51/5234* (2013.01); *H01L 2251/5323* (2013.01)

(58) Field of Classification Search
CPC ................................................... H01L 51/5228
See application file for complete search history.

(56) References Cited

U.S. PATENT DOCUMENTS

| 7,161,184 B2 * | 1/2007 | Miyagi ................ G09G 3/3233 257/59 |
| 9,530,980 B2 * | 12/2016 | Oh ....................... H01L 51/5228 |
| 2011/0204369 A1 * | 8/2011 | Ha ....................... H01L 51/5228 257/59 |
| 2014/0154829 A1 | 6/2014 | Oh et al. |

(Continued)

FOREIGN PATENT DOCUMENTS

CN            103715230 A       4/2014

*Primary Examiner* — Jamie C Niesz

(74) *Attorney, Agent, or Firm* — Birch, Stewart, Kolasch & Birch, LLP

(57) ABSTRACT

A see-through organic light emitting display device including a light emitting region having a transparent anode, an organic light emitting layer, and a transparent cathode, and a see-through region having a transparent auxiliary electrode, which is configured to transmit external light. The transparent auxiliary electrode can be made from the same material as the transparent anode and separated from the transparent anode, and the transparent cathode extends into the see-through region so as to be electrically connected with the transparent auxiliary electrode.

20 Claims, 18 Drawing Sheets

(56) References Cited

U.S. PATENT DOCUMENTS

2014/0183479 A1* 7/2014 Park ................. H01L 51/56
                                                    257/40
2014/0183501 A1   7/2014 Kim et al.
2014/0312323 A1* 10/2014 Park ................ H01L 51/525
                                                    257/40

* cited by examiner

SEE-THROUGH ORGANIC LIGHT EMITTING DISPLAY DEVICE AND METHOD FOR MANUFACTURING THE SAME

CROSS-REFERENCE TO RELATED APPLICATIONS

This application claims the priority of Patent Application No. 10-2014-0165538 filed on Nov. 25, 2014, in the Republic of Korea, Patent Application No. 10-2014-0165087 filed on Nov. 25, 2014, in the Republic of Korea, Patent Application No. 10-2014-0170476 filed on Dec. 2, 2014, in the Republic of Korea, and Patent Application No. 10-2015-0061510 filed on Apr. 30, 2015, in the Republic of Korea, the disclosures of all of which are incorporated herein by reference.

BACKGROUND OF THE INVENTION

Field of the Invention

The present disclosure relates to a see-through organic light emitting display device and a method for manufacturing the same, and more particularly, to a see-through organic light emitting display device in which an area of a see-through region is maximized by using a transparent auxiliary electrode and a method for manufacturing the same.

Description of the Related Art

An organic light emitting display device is a self-light emitting display that does not need a separate light source unlike a liquid crystal display device. Thus, the organic light emitting display device can be manufactured into a light-weight and thin form. Further, the organic light emitting display device is advantageous in terms of power consumption since it is driven with a low voltage. Also, the organic light emitting display device has a high response speed, a wide viewing angle, and an infinite contrast ratio. Therefore, the organic light emitting display device is considered to be a next-generation display device.

Since the organic light emitting display device can be easily manufactured into a thin form, it can be used as a see-through display device which is transparent and capable of displaying an image. A see-through organic light emitting display device includes a light emitting region where sub-pixels each including an organic light emitting element are disposed and a see-through region configured to transmit a background view through the organic light emitting display device. In order to increase the transmissivity (transparency) of the see-through organic light emitting display device, an area of the see-through region needs to be maximized. Particularly, as the resolution of the see-through organic light emitting display device is increased, the number of sub-pixels is increased, and the number of lines for driving the sub-pixels is also increased in proportion to the increase in the number of sub-pixels. Thus, there is a difficulty in securing a sufficient area of the see-through region. Particularly, if the transmissivity is too low, the background view perceived through the see-through display may be too dim.

A top-emission organic light emitting display device uses a transparent electrode or a translucent (semi-transparent) electrode as an upper electrode (e.g., a cathode) in order to emit light from an organic light emitting layer to an upper side, and translucent can refer to a semi-transparent property. A VSS voltage is applied to the cathode. Herein, in order to increase the transmissivity of the cathode, the cathode is formed to have a very thin thickness. However, a decrease in the thickness of the cathode causes an increase in a line resistance of the cathode.

Further, in a large-area organic light emitting display device, as a distance from a voltage supply pad is increased, a line resistance of a cathode is increased in proportion to the distance. Therefore, as the distance from the voltage supply pad increases, a voltage drop (or VSS rising) occurs more severely, which may cause non-uniformity in luminance of the organic light emitting display device. In the present disclosure, the term "voltage drop" refers to a decrease in a potential difference formed in an organic light emitting element, and more specifically, a decrease in a potential difference between an anode and a cathode of an organic light emitting element.

In other words, since a distance between each sub-pixel and a voltage supply pad varies, a line resistance of a cathode in each sub-pixel also varies. Therefore, a degree of voltage drop in each sub-pixel varies depending on a line resistance value of the cathode, resulting in non-uniformity in luminance of the organic light emitting display device.

In order to address such voltage drop issues, an auxiliary electrode may be used. The auxiliary electrode reduces a line resistance between a voltage supply pad and a cathode by electrically connecting the voltage supply pad with the cathode. However, since the see-through organic light emitting display device has a relatively narrow region in which the auxiliary electrode can be formed, the auxiliary electrode has a limit in reducing a line resistance of the cathode.

Further, since an incident angle at which a material to be used as an organic light emitting layer is deposited on an organic light emitting display panel is different depending on a position of a source for the material to be used as an organic light emitting layer, a voltage drop may occur differently in the overall organic light emitting display panel.

To be more specific, since the source of the organic light emitting layer is heated in a crucible and then deposited, an incident angle for deposition is determined on the basis of a position of the crucible within a chamber. If the material to be used as an organic light emitting layer is incident at an smaller angle than a reverse-taper angle of a partition wall, the organic light emitting layer is also formed in a region on the auxiliary electrode hidden by the partition wall. Therefore, an area of the organic light emitting layer which may be formed in the region on the auxiliary electrode hidden by the partition wall may vary, and a contact area between the auxiliary electrode and the cathode may also vary.

In particular, when the contact area between the cathode and the auxiliary electrode decreases, an overcurrent may flow in a narrow contact area causing undesirable heat to be created. Thus, a burnt defect may occur in the display device.

Accordingly, in order to secure luminance uniformity of the large-area top-emission organic light emitting display device regardless of a position of the organic light emitting display panel, there is a need of a method for uniformly maintaining the contact area between the auxiliary electrode and the cathode.

SUMMARY OF THE INVENTION

The inventors of the present disclosure recognized that since a see-through region of a see-through organic light emitting display device needs to have transparency and transmissivity sufficient to perceive background objects through the see-through organic light emitting display device, it is difficult to dispose a typical auxiliary electrode. Further, the inventors of the present disclosure recognized that since the space for forming an auxiliary electrode is very small, except for in the see-through region, there is a limit in improving voltage drop problems. Particularly, since an auxiliary electrode of the related art is formed using an opaque metal having a low electrical resistance, if an area of the auxiliary electrode is increased, then an area of the see-through region is decreased. Thus, transmissivity of the organic light emitting display device is also decreased. Accordingly, the inventors of the present disclosure conducted various research efforts to come up with an auxiliary electrode capable of effectively improving voltage drop problems while minimizing a decrease in transmissivity of a see-through organic light emitting display device. As a result, the inventors have provided a see-through organic light emitting display device including a transparent auxiliary electrode formed in a wide see-through region and a method for manufacturing the same.

Accordingly, an object to be achieved by the present disclosure is to provide a see-through organic light emitting display device which has improved voltage uniformity due to improved handling of voltage drop issues while a maximized transmissivity is obtained by disposing a transparent auxiliary electrode formed of a transparent conductive oxide in a wide see-through region, and a method for manufacturing the same.

Another object to be achieved by the present disclosure is to provide a see-through organic light emitting display device which has a minimized parasitic capacitance between an auxiliary electrode and the lines under the planarization layer 161 by disposing the auxiliary electrode on a planarization layer, and a method for manufacturing the same.

Yet another object to be achieved by the present disclosure is to provide a see-through organic light emitting display device in which a collapsed part (a recess) is formed in a partition wall disposed on a transparent auxiliary electrode, so that a covering area of an organic light emitting layer on the transparent auxiliary electrode under the partition wall can be minimized. Also, a column part and a roof part of the partition wall are formed of different materials such that their respective development rate is different, so that the probability of depositing material to be used as the organic light emitting layer on the transparent auxiliary electrode under the partition wall can be minimized, in a method for manufacturing an organic light emitting display device.

The objects of the present disclosure are not limited to the aforementioned objects, and other objects, which are not mentioned above, will be apparent to a person having ordinary skill in the art from the following description.

According to an aspect of the present disclosure to achieve the above-described objects, there is provided a see-through organic light emitting display device including: a light emitting region; and a see-through region. A transparent anode, an organic light emitting layer, and a transparent cathode are disposed in the light emitting region. A transparent auxiliary electrode is disposed in the see-through region, and the see-through region is configured to transmit external light. The transparent auxiliary electrode is formed of the same material as the transparent anode and is disposed so as to be separated from the transparent anode. The transparent cathode is extended to the see-through region so as to be electrically connected with the transparent auxiliary electrode. In the see-through region of the see-through organic light emitting display device according to an aspect of the present disclosure, the transparent auxiliary electrode having transparency and configured to be overlapped with the see-through region is disposed. Therefore, an area of the see-through region can be maximized and a voltage drop of the see-through organic light emitting display device can be reduced. Thus, luminance uniformity can be improved.

According to another feature of the present disclosure, in the see-through organic light emitting display device, the transparent anode, the transparent cathode, and the transparent auxiliary electrode are formed of transparent conductive oxides. The transparent cathode is formed of a different material from the transparent anode and the transparent auxiliary electrode.

According to yet another feature of the present disclosure, the transparent cathode is formed of a material that generates fewer foreign substances than materials of the transparent anode and the transparent auxiliary electrode.

According to still another feature of the present disclosure, the see-through organic light emitting display device further includes a transparent encapsulation layer including at least a first inorganic encapsulation layer, an organic layer, and a second inorganic encapsulation layer. The transparent encapsulation layer is disposed on the transparent cathode so as to cover the light emitting region and the see-through region.

According to still another feature of the present disclosure, the see-through organic light emitting display device further includes a partition wall disposed on the transparent auxiliary electrode, and the organic light emitting layer is disposed so as to cover a majority or an entirety of the see-through region. For example, the transparent electrode can be patterned such that one or more empty regions are included to increase the transparency of the see-through region. The transparent cathode is formed of a material having a higher step coverage than the organic light emitting layer and is electrically connected with the transparent auxiliary electrode.

According to still another feature of the present disclosure, the see-through organic light emitting display device further includes: a dielectric layer disposed under the transparent auxiliary electrode and the transparent anode; and a bottom transparent auxiliary electrode disposed under the dielectric layer. The bottom transparent auxiliary electrode is electrically connected with the transparent auxiliary electrode through a contact hole formed in the dielectric layer and an area of the bottom transparent auxiliary electrode is greater than an area of the transparent auxiliary electrode. In another embodiment, the bottom transparent auxiliary electrode can be disposed only under the transparent anode in the light emitting region.

According to still another feature of the present disclosure, the bottom transparent auxiliary electrode is overlapped with the transparent anode. The bottom transparent auxiliary electrode is electrically insulated from the transparent anode by the dielectric layer.

According to still another feature of the present disclosure, the transparent auxiliary electrode is configured so as to cover the overall see-through region.

According to still another feature of the present disclosure, the see-through organic light emitting display device further includes: a dielectric layer disposed under the transparent auxiliary electrode and the transparent anode; and an opaque auxiliary electrode disposed on the dielectric layer and electrically connected with transparent auxiliary electrode. Further, the opaque auxiliary electrode is disposed between the light emitting region and an adjacent light emitting region adjacent to the light emitting region.

According to still another feature of the present disclosure, the see-through organic light emitting display device further includes a data line. The data line and the opaque auxiliary electrode perpendicularly intersect each other.

According to another aspect of the present disclosure to achieve the above-described objects, there is provided a see-through organic light emitting display device, including: a light emitting region; and a see-through region. A reflection layer, a transparent anode, an organic light emitting layer, and a transparent cathode are disposed in the light emitting region. A transparent auxiliary electrode is disposed in the see-through region, and the see-through region is configured to transmit external light. The light emitted from the organic light emitting layer is reflected from the reflection layer and transmitted through the transparent cathode. The transparent cathode is disposed so as to cover the light emitting region and the see-through region, and is electrically connected with the transparent auxiliary electrode. In the see-through organic light emitting display device according to another aspect of the present disclosure, the transparent cathode is disposed so as to cover all of the light emitting region and the see-through region, and is also electrically connected with the transparent auxiliary electrode. Therefore, it is possible to improve transmissivity and also possible to greatly reduce a total line resistance of the cathode.

According to another feature of the present disclosure, the see-through organic light emitting display device further includes a translucent cathode formed of a metallic material and disposed between the light emitting region and an adjacent light emitting region. A work function of the translucent cathode is lower than a work function of the transparent cathode.

According to yet another feature of the present disclosure, the translucent cathode has a first thickness and a second thickness. The first thickness is smaller than the second thickness, and the translucent cathode having the first thickness is disposed in the light emitting region. Further, the translucent cathode having the second thickness is disposed between the light emitting region and the adjacent light emitting region.

According to still another feature of the present disclosure, the second thickness is two times the first thickness, a transmissivity of the region having the first thickness is higher than a transmissivity of the region having the second thickness. Also, a resistance of the region having the second thickness is lower than a resistance of the region having the first thickness.

According to still another feature of the present disclosure, the translucent cathode is disposed between the organic light emitting layer and the transparent cathode.

According to still another feature of the present disclosure, the translucent cathode and the transparent auxiliary electrode are disposed so as to be parallel to each other. Further, the translucent cathode is disposed so as to cover the overall light emitting region.

According to still another feature of the present disclosure, the translucent cathode and the transparent auxiliary electrode are disposed so as to be separated from each other and electrically connected with each other by the transparent cathode.

According to yet another aspect of the present disclosure to achieve the above-described objects, there is provided a method for manufacturing a see-through organic light emitting display device, including: a step of forming a transparent anode on a substrate in a light emitting region and forming a transparent auxiliary electrode on the substrate in a see-through region configured to transmit external light so as to be separated from the transparent anode; a step of forming an organic light emitting layer on the transparent anode; and a step of forming a transparent cathode by extending the transparent cathode to the see-through region so as to be electrically connected with the transparent auxiliary electrode. The transparent anode, the organic light emitting layer, and the transparent cathode are formed in the light emitting region and the transparent auxiliary electrode is formed of the same material as the transparent anode. In the method for manufacturing a see-through organic light emitting display device according to yet another aspect of the present disclosure, the transparent auxiliary electrode having transparency is formed so as to be overlapped with the see-through region. Therefore, an area of the see-through region can be maximized and a total resistance of the transparent cathode can be reduced. Further, the transparent auxiliary electrode and the transparent anode can be formed at the same time. Therefore, an additional process for forming the transparent auxiliary electrode is not necessary. Thus, a manufacturing process of the see-through organic light emitting display device can be simplified.

According to another feature of the present disclosure, the transparent cathode, the transparent anode, and the transparent auxiliary electrode are formed by a sputtering process.

According to yet another feature of the present disclosure, the step of forming a transparent anode and a transparent auxiliary electrode includes: a step of forming a reflection layer in the light emitting region; a step of forming a transparent conductive oxide layer so as to cover the reflection layer; and a step of forming the transparent auxiliary electrode and the transparent anode separated from the transparent auxiliary electrode and disposed on the reflection layer by patterning the transparent conductive oxide layer.

According to still another feature of the present disclosure, the step of forming a reflection layer includes a step of forming an opaque auxiliary electrode between the light emitting region and an adjacent light emitting region adjacent to the light emitting region on the same plane as the reflection layer.

According to still another feature of the present disclosure, the step of forming a transparent cathode further includes a step of forming a translucent cathode so as to be in contact with the transparent cathode. The transparent cathode is formed in the see-through region and the light emitting region where the translucent cathode is formed of a metallic material and formed only in the light emitting region.

According to still another aspect of the present disclosure to achieve the above-described objects, there is provided a see-through organic light emitting display device. The see-through organic light emitting display device includes a planarization layer disposed on a plurality of pixels. A transparent anode is disposed on the planarization layer so as to correspond to one of the plurality of pixels. A transparent auxiliary electrode is disposed on the planarization layer so as to be separate from the transparent anode. A bank is disposed so as to cover a side portion of the transparent auxiliary electrode and a side portion of the transparent anode. A partition wall is disposed on the transparent auxiliary electrode and includes a column part and a roof part. An organic light emitting layer is disposed at least on the transparent anode. A transparent cathode is formed at least on the organic light emitting layer and is electrically connected with the transparent auxiliary electrode. The roof part is formed so as to equalize a contact area between the transparent auxiliary electrode and the cathode in the plurality of pixels. In the see-through organic light emitting display device according to still another aspect of the present disclosure, the roof part of the partition wall is configured to hide the transparent auxiliary electrode, so that a covering area of the organic light emitting layer on the transparent auxiliary electrode can be minimized. Further, the contact area between the transparent cathode and the transparent auxiliary electrode is equalized, so that luminance uniformity of the organic light emitting display device can be improved.

According to another feature of the present disclosure, the column part and the roof part are integrated as one body.

According to yet another feature of the present disclosure, the partition wall includes a collapsed part at a lower portion thereof.

According to still another feature of the present disclosure, a cross section of the column part has a square shape or a reverse-taper shape.

According to still another feature of the present disclosure, a cross section of the roof part has a square shape or a positive-taper shape.

Details of other exemplary embodiments will be included in the detailed description of the disclosure and the accompanying drawings.

The present disclosure has an effect of minimizing a decrease in transmissivity of a see-through organic light emitting display device by forming an auxiliary electrode of a transparent conductive oxide.

The present disclosure has an effect of minimizing a voltage drop by forming a transparent auxiliary electrode in a see-through region wider than a light emitting region thereby reducing a line resistance of a transparent cathode.

The present disclosure has an effect of minimizing a parasitic capacitance which may be generated between the lines under the planarization layer, which are disposed under a transparent auxiliary electrode and the planarization layer, by forming the transparent auxiliary electrode on the planarization layer.

The present disclosure can manufacture an organic light emitting display device in which a covering area of an organic light emitting layer on a transparent auxiliary electrode under a partition wall can be minimized. A contact area between a transparent cathode and the transparent auxiliary electrode under the partition wall can be equalized regardless of a position of an organic light emitting display panel.

The effects of the present disclosure are not limited to the aforementioned effects, and other various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
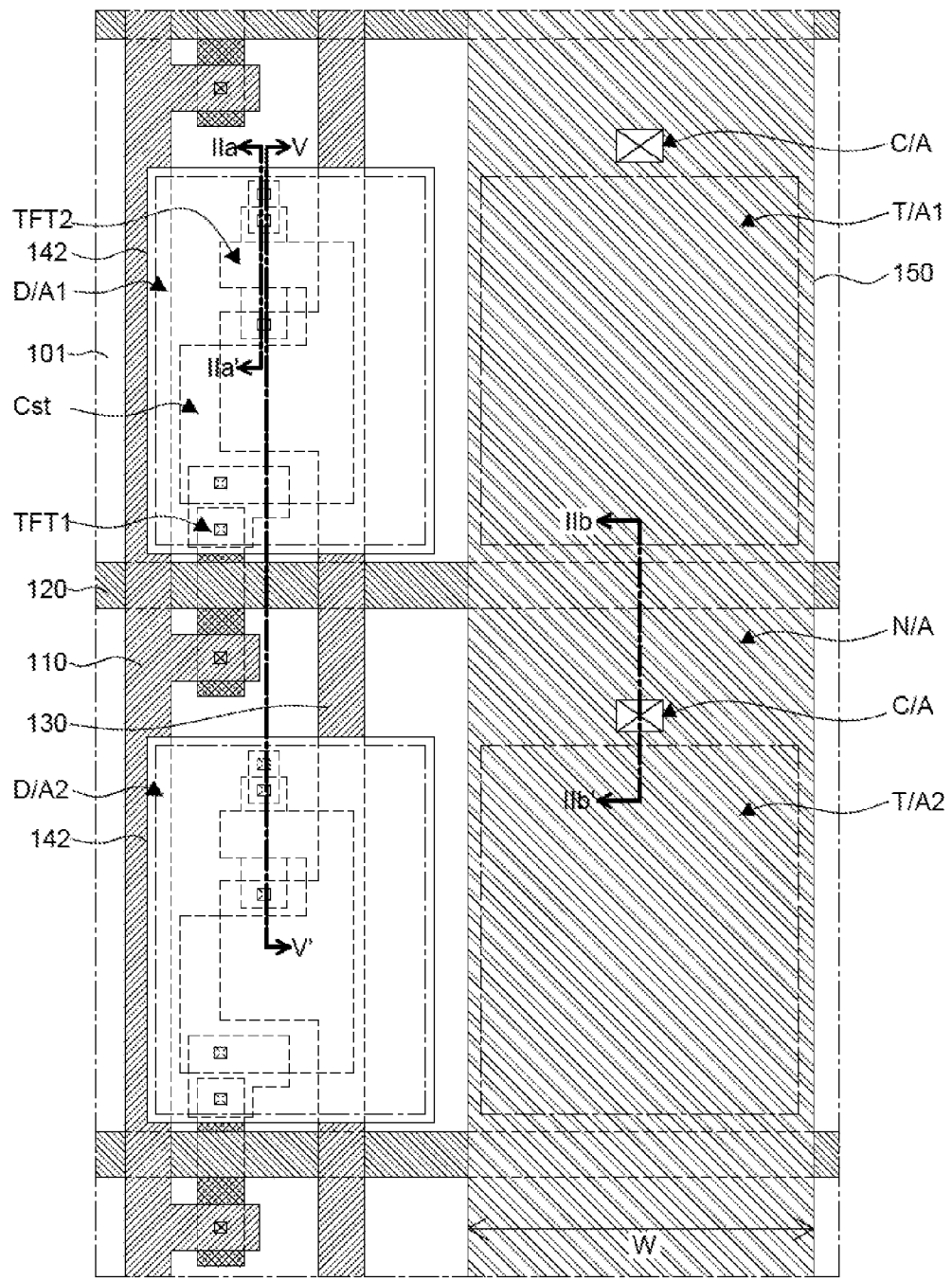
FIG. 1 is a schematic plan view provided to describe a see-through organic light emitting display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present disclosure. Further, in the following description, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", "next" and the like, one or more parts may be positioned between the two parts unless the terms are used with the term "immediately" or "directly" is not used.

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or overall bonded to or combined with each other and can be interlocked and operated in technically various ways as can be fully understood by a person having ordinary skill in the art, and the embodiments can be carried out independently of or in association with each other.

Hereinafter, various exemplary embodiments of the present disclosure will be described in detail with reference to the accompanying drawings.

Figure 2:
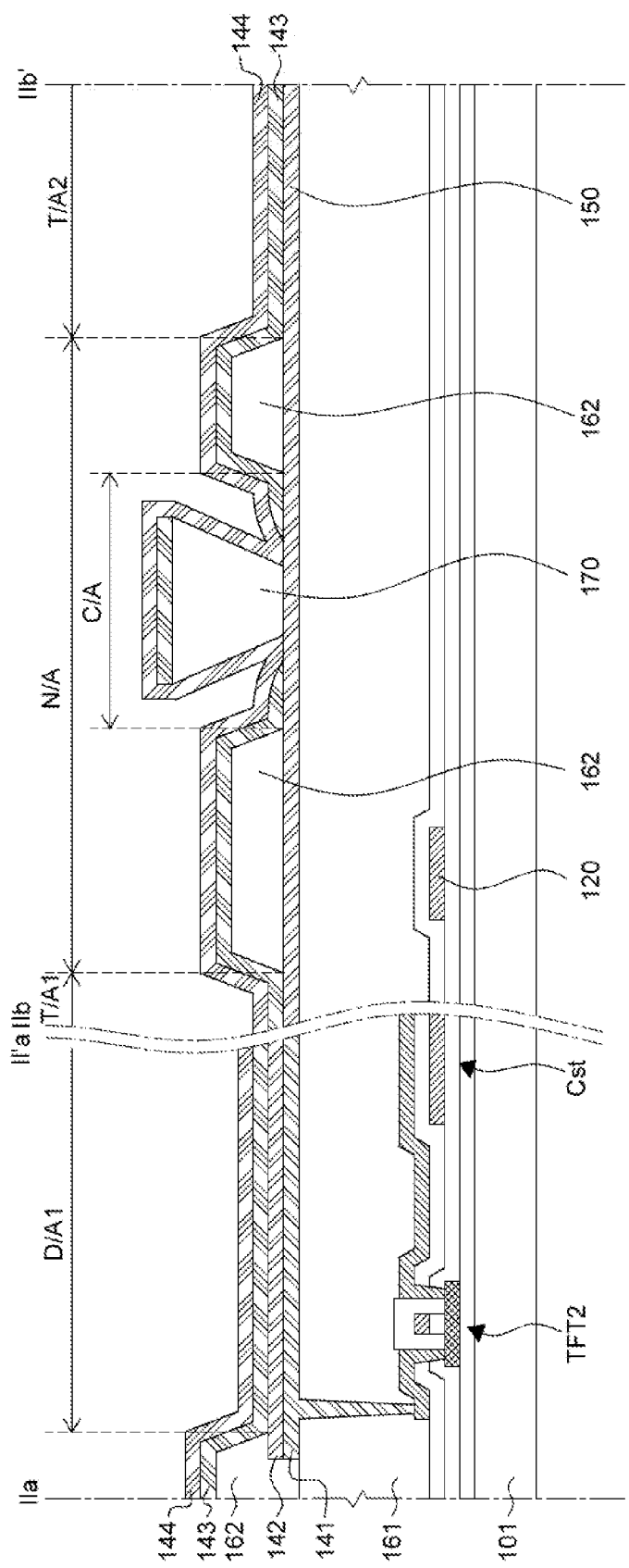
FIG. 2 is a cross-sectional view taken along a line IIa-IIa' and a line IIb-IIb' of FIG. 1.

FIG. 1 is a schematic plan view provided to describe a see-through organic light emitting display device according to an exemplary embodiment of the present disclosure. FIG. 2 is a cross-sectional view taken along a line IIa-IIa' and a line IIb-IIb' of FIG. 1. Referring to FIG. 1 and FIG. 2, a see-through organic light emitting display device 100 includes a substrate 101, an organic light emitting element, and a transparent auxiliary electrode 150. For convenience in explanation, FIG. 1 schematically illustrates two sub-pixels, and each of the sub-pixels is configured as a 2T1C structure including two thin film transistors and a capacitor. However, a structure of the sub-pixel is not limited to the 2T1C structure, and each sub-pixel may be configured to have various additional compensation structures such as a 3T1C structure including three thin film transistors and a capacitor or a 4T2C structure including four thin film transistors and two capacitors. Meanwhile, illustration of a reflection layer 141, an organic light emitting layer 143, and a transparent cathode 144 is omitted from FIG. 1, and thicknesses and shapes of respective lines are schematically illustrated.

The see-through organic light emitting display device 100 according to an exemplary embodiment of the present disclosure is a top-emission organic light emitting display device in which light emitted from the organic light emitting layer 143 is released in a direction of a top surface of the substrate 101. The top-emission see-through organic light emitting display device 100 includes the reflection layer 141 disposed under a transparent anode 142, and the light emitted from the organic light emitting layer 143 is released through the transparent cathode 144 configured to transmit light.

In the present disclosure, transmissivity of a specific component refers to the transmissivity with respect to visible light wavelengths. In the present disclosure, the transmissivity of a specific component is defined as a ratio of an amount of light transmitted through the specific component to an amount of light incident into the specific component.

In the present disclosure, transparency refers to a characteristic that allows an object of a background to be visible through the see-through organic light emitting display device.

In order to improve transparency, it is necessary to minimize distortion of the transmitted background. For example, a surface of a substrate may be formed to be flat. If the surface of the substrate is not flat, refraction, scattering, and reflection of transmitted light may cause a decrease in transparency. Each layer having transparency and disposed in the see-through region may also be formed to be flat.

In the present disclosure, the components having transparency, for example, the transparent cathode, the transparent auxiliary electrode, the bottom transparent auxiliary electrode, and the transparent conductive oxide layer, may have a visible light transmissivity of 80% or more.

In the present disclosure, the components having translucence, for example, the translucent cathode, may have a visible light transmissivity of 30% to less than 80%.

However, transparency and translucence may not be limited to such values, and should be construed in consideration of a purpose and a function of each component to be substantially disclosed in the present disclosure.

Referring to FIG. 1, the substrate 101 is configured to support various components of the see-through organic light emitting display device 100, and may be a glass substrate or a transparent plastic substrate having a high transmissivity. Further, the substrate is configured to have excellent transparent characteristics. The substrate 101 includes a plurality of light emitting regions D/A1 and D/A2, a plurality of see-through regions T/A1 and T/A2, and a non-display region N/A. FIG. 1 illustrates two light emitting regions D/A1 and D/A2, and two see-through regions T/A1 and T/A2. The light emitting regions D/A1 and D/A2 refer to regions where the organic light emitting elements are disposed and an image is displayed, and may be referred to as pixel areas or sub-pixels. The see-through regions T/A1 and T/A2 refer to regions where an image is not displayed and background objects can be viewed through the substrate 101, and thus may be referred to as a transparent window. Since the see-through regions T/A1 and T/A2 allow external light to pass through, the see-through organic light emitting display device 100 has transparency. The non-display region N/A refers to regions other than the light emitting regions D/A1 and D/A2 and the see-through regions T/A1 and T/A2. In particular, the see-through regions T/A1 and T/A2 may be configured to have transparency such that background objects can be seen through the see-through organic light emitting display device 100.

A data line 110 and a gate line 120 are disposed so as to intersect (or overlap) each other on the substrate 101. The light emitting regions D/A1 and I/A2 and the see-through regions T/A1 and T/A2 may be respectively included in regions defined by the data line 110 and the gate line 120 intersecting each other, but are not limited thereto. Although FIG. 1 illustrates the data line 110 and the gate line 120 having a straight shape, the data line 110 and the gate line 120 may have a diagonal, curve, or zigzag shape, but are not limited thereto.

Each of a first thin film transistor TFT1 and a second thin film transistor TFT2 includes a gate electrode, a source electrode, and a drain electrode, and may be a P-type thin film transistor or an N-type thin film transistor. For convenience in explanation, FIG. 1 and FIG. 2 illustrate P-type thin film transistors. Further, each of the first thin film transistor TFT1 and the second thin film transistor TFT2 may have a coplanar structure in which a gate electrode is disposed on an active layer or an inverted-staggered structure in which a gate electrode is disposed under an active layer. For convenience in explanation, FIG. 1 and FIG. 2 illustrate a thin film transistor having a coplanar structure. However, the thin film transistor included in the see-through organic light emitting display device 100 according to an exemplary embodiment of the present disclosure is not limited to a P-type thin film transistor and the structure of the thin film transistor is not limited to the coplanar structure. It should be noted that all of the thin film transistors (TFTs) on the panel need not be of the same type or structure. Namely, a single panel may have multiple types of TFTs and/or TFTs with various types of structures.

The gate electrode of the first thin film transistor TFT1 is connected with the gate line 120, the source electrode is connected with the data line 110, and the drain electrode is connected with an electrode of a storage capacitor Cst formed of the same metal as the gate line 120 and the gate electrode of the second thin film transistor TFT2. The first thin film transistor TFT1 may be referred to as a switching transistor. The source electrode of the second thin film transistor TFT2 is connected with a VDD line 130 and an opposite electrode of the storage capacitor Cst formed of the same metal as the data line 110. Further, the drain electrode is connected with the first thin film transistor TFT1 and the transparent anode 142 of the organic light emitting element. The second thin film transistor TFT2 may be referred to as a driving transistor.

The VDD line 130 supplies a VDD voltage to the organic light emitting element.

The first thin film transistor TFT1, the second thin film transistor TFT2, the storage capacitor Cst, the data line 110, the gate line 120, and the VDD line 130 are not disposed in the see-through regions T/A1 and T/A2. For example, the first thin film transistor TFT1, the second thin film transistor TFT2, and the storage capacitor Cst are disposed in the light emitting regions D/A1 and D/A2 but are not overlapped with the see-through regions T/A1 and T/A2. The data line 110 and the gate line 120 are disposed in the non-display region N/A but not disposed in the see-through regions T/A1 and T/A2. Further, the VDD line 130 is extended so as to pass through the light emitting regions D/A1 and D/A2 but does not pass through the see-through regions T/A1 and T/A2. That is, only transparent layers having an excellent visible light transmissivity are disposed in the see-through regions T/A1 and T/A2. Thus, the see-through regions T/A1 and T/A2 can achieve an excellent visible light transmissivity. Further, since the see-through regions T/A1 and T/A2 are disposed on a planarization layer 161, the see-through regions T/A1 and T/A2 can have excellent transparency with less distortion.

Referring to FIG. 2, the planarization layer 161 is disposed so as to cover the first thin film transistor TFT1, the second thin film transistor TFT2, the storage capacitor Cst, and the VDD line 130. The planarization layer 161 planarizes the top surface of the substrate 101, and may be formed of a transparent organic insulation material. The planarization layer 161 is thick enough to planarize a step caused by the first thin film transistor TFT1, the second thin film transistor TFT2, and the storage capacitor Cst.

The reflection layer 141 electrically connected with the second thin film transistor TFT2 is disposed on the planarization layer 161. For example, the reflection layer 141 is separately disposed in each of the light emitting regions D/A1 and D/A2. The reflection layer 141 reflects the light emitted from the organic light emitting layer 143 to an upper side. The reflection layer 141 may be formed of silver (Ag), nickel (Ni), gold (Au), platinum (Pt), aluminum (Al), copper (Cu), APC, molybdenum/aluminum neodymium (Mo/AlNd) or alloys thereof having an excellent reflectivity. In addition, the reflection layer can be configured to reflect light emitted from the organic light emitting layer through the transparent cathode.

The transparent anode 142 is disposed on the reflection layer 141. For example, the transparent anode 142 is separately disposed in each of the light emitting regions D/A1 and D/A2 in the same manner as the reflection layer 141. The transparent anode 142 supplies holes to the organic light emitting layer 143. The transparent anode 142 may be formed of a transparent conductive oxide (TCO) having a high work function, such as indium tin oxide (ITO), indium zinc oxide (IZO), indium tin zinc oxide (ITZO), zinc oxide, and tin oxide, in order to readily supply holes. Although the reflection layer 141 and the transparent anode 142 are differentially described in the present disclosure, the transparent anode 142 and the reflection layer 141 may not be differentiated but may be referred to as one transparent anode or reflective anode.

A transparent auxiliary electrode 150 is separated from the transparent anode 142 and disposed in the see-through regions T/A1 and T/A2. The transparent auxiliary electrode 150 is configured to cover the plurality of see-through regions T/A1 and T/A2. For example, as illustrated in FIG. 1, the transparent auxiliary electrode 150 may be extended so as to cover the first see-through region T/A1, the second see-through region T/A2, and the non-display region N/A between the first see-through region T/A1 and the second see-through region T/A2. Therefore, if the transparent auxiliary electrode 150 is disposed so as to cover the non-display region N/A, a line resistance similar to that of an auxiliary electrode of the related art can be achieved, and a decrease in an aperture ratio of the see-through regions T/A1 and T/A2 of the see-through organic light emitting display device 100 can be minimized at the same time.

According to this configuration, since the transparent auxiliary electrode 150 is extended in one direction, it can be connected with a voltage supply pad in a peripheral region of the see-through organic light emitting display device 100. Therefore, a VSS voltage can be transferred from the voltage supply pad through the transparent auxiliary electrode 150. The transparent auxiliary electrode 150 may have a preset width W. For example, the transparent auxiliary electrode 150 may have the same width as the first see-through region T/A1 and the second see-through region T/A2.

As illustrated in FIG. 2, the transparent auxiliary electrode 150 is disposed on the planarization layer 161. As described above, since the planarization layer 161 has a sufficient thickness, a parasitic capacitance which may be generated between the transparent auxiliary electrode 150 and the lines under the planarization layer 161 can be reduced. Further, planarization may improve transparency of the see-through regions. For example, as illustrated in FIG. 2, although the gate line 120 may be disposed under the transparent auxiliary electrode 150, the relatively thick planarization layer 161 is disposed between the gate line 120 and the transparent auxiliary electrode 150. Thus, a parasitic capacitance which may be generated between the transparent auxiliary electrode 150 and the gate line 120 can be minimized.

The transparent auxiliary electrode 150 is electrically connected with the transparent cathode 144. For example, as illustrated in FIG. 1, the transparent auxiliary electrode 150 is electrically connected with the transparent cathode 144 in a contact region C/A positioned in the non-display region N/A. Therefore, the transparent auxiliary electrode 150 reduces a voltage drop caused by a high line resistance of the transparent cathode 144.

Further, the transparent auxiliary electrode 150 may be formed of the same material as the transparent anode 142. For example, the transparent auxiliary electrode 150 may be formed of a transparent conductive oxide, such as ITO, IZO, ITZO, zinc oxide, and tin oxide, having an excellent transmissivity.

A bank 162 is disposed on the transparent anode 142 and the transparent auxiliary electrode 150, and has openings corresponding to the light emitting regions D/A1 and D/A2, the see-through regions T/A1 and T/A2, and the contact region C/A. That is, as illustrated in FIG. 2, the bank 162 surrounds a periphery of the transparent anode 142, and a top surface of the transparent anode 142 is exposed in the light emitting regions D/A1 and D/A2.

As described above, since the bank 162 has the openings corresponding to the see-through regions T/A1 and T/A2, a top surface of the transparent auxiliary electrode 150 is exposed in the see-through regions T/A1 and T/A2, but is not limited thereto. The bank 162 can also be configured so as to cover the see-through regions T/A1 and T/A2.

The bank 162 is configured to separate adjacent sub-pixel regions and separate a light emitting region D/A and a see-through region T/A in the same sub-pixel region. The bank 162 may be formed of a transparent organic insulation material, for example, any one of polyimide, photo acryl, and benzocyclobutene (BCB), or may be formed of a material having black color, for example, black resin.

A part of the top surface of the transparent auxiliary electrode 150 is exposed through the opening of the bank 162 corresponding to the contact region C/A. Although FIG. 1 illustrates a shape of the contact region C/A as a rectangular shape, the contact region C/A may have a polygonal shape, a circular shape, or an oval shape instead of the rectangular shape. The shape of the contact region C/A is not particularly limited.

The bank 162 may be formed of an organic insulation material, and may have a taper shape. Referring to FIG. 2 again, the taper shape refers to a shape in which a width of the bank 162 decreases from its base to its distal end that is upwardly away from the substrate 101. If the bank 162 has a taper shape, the bank 162 may be formed of a photoresist. The bank 162 has a thickness that is sufficient to separate the first light emitting region D/A1 and the second light emitting region D/A2 adjacent to each other, and to separate the first light emitting region D/A1 and the first see-through region T/A1 adjacent to each other.

Referring to FIG. 2, a partition wall 170 is disposed in the contact region C/A. The partition wall 170 is formed to have a reverse-taper shape. The reverse-taper shape refers to a shape in which a width of the bank partition wall 170 increases from its base to its distal end that is upwardly away from the substrate 101. The partition wall 170 is disposed within the opening of the bank 162 in the non-display region N/A. This opening may be referred to as the contact region C/A. A bottom surface of the partition wall 170 is in contact with a partial region of the transparent auxiliary electrode 150, and an area of a top surface of the partition wall 170 is greater than an area of the bottom surface of the partition wall 170. Therefore, a lower part of the partition wall 170 is shaded (or partially covered) by the reverse-taper shape of the partition wall 170.

The partition wall 170 may be thicker than the bank 162. For example, the partition wall 170 may have a thickness of about 1 μm to about 2.5 μm. If the partition wall 170 is thicker than the bank 162, the partition wall 170 may be more readily formed to have the reverse-taper shape. In some exemplary embodiments, the partition wall 170 may be disposed on the bank 162. In this case, the island-shaped bank 162 may be further disposed on a central part of the contact region C/A and the partition wall 170 may be disposed on the island-shaped bank 162.

The organic light emitting layer 143 is disposed in the light emitting regions D/A1 and D/A2, the see-through regions T/A1 and T/A2, and the non-display region N/A. For example, the organic light emitting layer 143 is disposed on the transparent anode 142 exposed in the light emitting regions D/A1 and D/A2. The organic light emitting layer 143 emits a red, green, blue, or white light on the basis of holes transferred from the transparent anode 142 and electrons transferred from the transparent cathode 144 in the light emitting regions D/A1 and D/A2. Further, since the organic light emitting layer 143 is transparent in a non-light emitting state, the organic light emitting layer 143 is also disposed on the transparent auxiliary electrode 150 in the see-through regions T/A1 and T/A2. In this case, a decrease in transmissivity caused by the organic light emitting layer 143 may not substantially occur.

The organic light emitting layer 143 is disposed on the bank 162 in the non-display region N/A and configured so as to cover a partial side surface of the bank 162 and the top surface of the partition wall 170 in the contact region C/A. That is, the organic light emitting layer 143 may not cover a partial top surface of the transparent auxiliary electrode 150 exposed between a side surface of the partition wall 170 and a side surface of the bank 162. Therefore, a physical space for a contact between the transparent cathode 144 and the transparent auxiliary electrode 150 can be secured between the side surface of the bank 162 and the side surface of the partition wall 170. The organic light emitting layer 143 may be formed by depositing an organic light emitting substance so as to cover all of the light emitting regions D/A1 and D/A2, the see-through regions T/A1 and T/A2, and the non-display region N/A. Generally, the organic light emitting substance is formed of a material having low step coverage. Due to the step coverage of the organic light emitting substance, the organic light emitting substance is not deposited on a part shaded by the reverse-taper shape of the partition wall 170 and the side surface of the partition wall 170. Further, the organic light emitting substance is deposited on the top surfaces of the partition wall 170 and the bank 162. Therefore, a physical space can be secured between the side surface of the partition wall 170 and the side surface of the bank 162, in which the transparent auxiliary electrode 150 and the transparent cathode 144 can be electrically connected. That is, the organic light emitting layer 143 is cut and separated by the partition wall 170. However, a structure of the physical space for a contact between the transparent cathode 144 and the transparent auxiliary electrode 150 is not limited thereto.

The transparent cathode 144 is disposed on the organic light emitting layer 143. For example, the transparent cathode 144 is disposed so as to cover the light emitting regions D/A1 and D/A2, the see-through regions T/A1 and T/A2, and the non-display region N/A. Herein, the transparent cathode 144 is connected with the transparent auxiliary electrode 150, thereby reducing a voltage drop in the light emitting regions D/A1 and D/A2.

The transparent cathode 144 is formed of a transparent conductive oxide. For example, the transparent cathode 144 may be formed of a transparent conductive oxide such as ITO, IZO, ITZO, zinc oxide, or tin oxide, and may be formed of the same transparent conductive oxide as the transparent anode 142 and the transparent auxiliary electrode 150. Since the transparent cathode 144 needs to supply electrons to the organic light emitting layer 143, the transparent cathode 144 needs to have a high electrical conductivity and a low work function. However, the transparent cathode 144 formed of a transparent conductive oxide has a high work function. Thus, it may be difficult to readily supply electrons to the organic light emitting layer 143. In order to solve such problem, a metal doping layer may be disposed between the transparent cathode 144 and the organic light emitting layer 143. The metal doping layer enables electrons supplied from the transparent cathode 144 to be readily injected into the organic light emitting layer 143. The metal doping layer is doped with a metallic dopant. The metallic dopant may include any one selected from aluminum-based metals including aluminum or aluminum neodymium, alkali metals such as lithium (Li), alkali earth metals such as magnesium (Mg), or mixtures thereof. In order to suppress a decrease in transmissivity in the see-through regions T/A1 and T/A2, the metal doping layer may be disposed only in the light emitting regions D/A1 and D/A2. A see-through organic light emitting display device further including a separate cathode formed of the same metallic material as the metal doping layer will be described later with reference to FIG. 3 and FIG. 4.

Further, an electron injection layer (EIL) may be further disposed between the transparent cathode 144 and the organic light emitting layer 143 in order to facilitate the electron injection into the organic light emitting layer 143 from the transparent cathode 144.

Furthermore, the transparent cathode 144 may be formed of a material different from the transparent anode 142 and the transparent auxiliary electrode 150. To be specific, the transparent cathode 144 may be formed of a material that generates fewer foreign substances than materials of the transparent anode 142 and the transparent auxiliary electrode 150. For example, if the transparent anode 142 and the transparent auxiliary electrode 150 are formed of ITO, the transparent cathode 144 may be formed of IZO that generates fewer foreign substances than ITO during a manufacturing process.

Since the transparent cathode 144 is formed of a material that generates fewer foreign substances than materials of the transparent anode 142 and the transparent auxiliary electrode 150, fewer foreign substances are generated in the transparent cathode 144. Also, in a process for forming a transparent encapsulation layer to be disposed on the transparent cathode 144, an effect of foreign substances from the transparent cathode 144 can be minimized. The transparent encapsulation layer is configured to protect the organic light emitting element against oxygen and moisture. Particularly, if a crack or a seam occurs in the transparent encapsulation layer, a moisture permeation path is formed, and, thus, defects may occur. To be more specific, if fewer foreign substances are generated in the transparent cathode 144, the possibility of cracks or seams from occurring in the transparent encapsulation layer caused by a foreign substance after the transparent encapsulation layer is deposited on the transparent cathode 144 is reduced. Therefore, defects of the transparent encapsulation layer can be minimized and manufacturing yield can be increased to better achieve mass production. Herein, the transparent encapsulation layer includes at least a first inorganic encapsulation layer, an organic layer, and a second inorganic encapsulation layer, and is disposed on the transparent cathode 144 so as to cover a light emitting region and a see-through region. Herein, the first inorganic encapsulation layer and the second inorganic encapsulation layer are configured to seal the organic layer in a peripheral region.

Particularly, if the above-described transparent encapsulation layer is applied, the display panel or device can still be flexible (e.g., the transparent encapsulation layer can be made from a flexible material).

The transparent cathode 144 can be in direct contact with the exposed top surface of the transparent auxiliary electrode 150 between the side surface of the partition wall 170 and the side surface of the bank 162 in the contact region C/A. Since the transparent conductive oxide constituting the transparent cathode 144 has high step coverage, the transparent cathode 144 may be continuously formed from the top surface of the bank 162 to the side surface of the bank 162, the side surface of the partition wall 170, and the top surface of the partition wall 170. Thus, the transparent cathode 144 can be in contact with the exposed area of the transparent auxiliary electrode 150 between the side surface of the partition wall 170 and the side surface of the bank 162, so that the transparent cathode 144 and the transparent auxiliary electrode 150 are electrically connected with each other. In order to securely connect the transparent cathode 144 with the transparent auxiliary electrode 150, preferably, the transparent cathode 144 may be formed to have sufficient thickness. For example, the transparent cathode 144 may be formed to have a thickness of about 1000 Å or more. But the transparent cathode 144 is not limited to such thickness, as the particular thickness may depend upon various factors and characteristics related to the display device and thus can be adjusted accordingly.

Although FIG. 2 illustrates an example where the organic light emitting layer 143 is disposed on the overall surface of the substrate 101 so as to cover all of the light emitting regions D/A1 and D/A2, the see-through regions T/A1 and T/A2, and the non-display region N/A, the organic light emitting layer 143 may be disposed only on the transparent anode 142 in the light emitting regions D/A1 and D/A2 but not in the non-display region N/A and the see-through regions T/A1 and T/A2. In order to form the organic light emitting layer 143 only in the light emitting regions D/A1 and D/A2, a so-called FMM (Fine Metal Mask) or shadow mask may be used. To be more specific, the organic light emitting layer 143 may be formed by using an FMM including openings corresponding to the light emitting regions D/A1 and D/A2. In this case, the top surface of the transparent auxiliary electrode 150 can be exposed without the partition wall 170. Further, the transparent cathode 144 and the transparent auxiliary electrode 150 can be electrically connected with each other without the partition wall 170.

As described above, since the transparent auxiliary electrode 150 is electrically connected with the transparent cathode 144, a line resistance between the voltage supply pad and the transparent cathode 144 can be reduced. That is, since the transparent cathode 144 is formed of a transparent conductive oxide, it has a higher resistivity than typical metal line materials. Further, since the transparent auxiliary electrode 150 is electrically connected with the transparent cathode 144, an overall line resistance between the voltage supply pad and the transparent cathode 144 can be reduced. Thus, it is possible to reduce voltage drops caused by a resistance of the transparent cathode 144 and it is also possible to improve luminance uniformity of the see-through organic light emitting display device 100.

Further, since the transparent auxiliary electrode 150 is formed of a transparent conductive oxide, it may be disposed so as to cover all of the see-through regions T/A1 and T/A2 and the transmissivity of the see-through organic light emitting display device 100 is minimally decreased.

Generally, an opaque metal such as silver, aluminum, molybdenum, titanium, copper or alloys thereof has a lower resistivity, but has a higher reflectivity than a transparent conductive oxide. For example, if a metal auxiliary electrode having a width of 10 m and a thickness of 1000 Å is formed using a silver alloy, when a unit length of the metal auxiliary electrode is converted to a length of a sub-pixel, for example, the metal auxiliary electrode may have a line resistance of 25.2Ω per unit length under such configuration and a total line resistance of the transparent cathode 144 which is connected with the metal auxiliary electrode may be reduced. However, since the metal auxiliary electrode is opaque, as the width of the metal auxiliary electrode is increased by 10 μm, the transmissivity of the see-through organic light emitting display device 100 may be decreased by, for example, 3 to 4%. In other words, the transmissivity of the see-through organic light emitting display device 100 is determined in consideration of not only a visible light transmissivity of a see-through region but also an aperture ratio of the see-through region and a visible light transmissivity of materials disposed in the see-through region. Therefore, there are difficulties in reducing voltage drops of the see-through organic light emitting display device 100 while preserving the transmissivity of the see-through organic light emitting display device 100 when using the opaque metal auxiliary electrode. Meanwhile, the transparent auxiliary electrode 150 has a higher resistivity than metals, but as illustrated in FIG. 1, it can be disposed so as to cover all of the see-through regions T/A1 and T/A2 and the transmissivity is barely decreased. Therefore, if the transparent auxiliary electrode 150 is formed in a relatively wide region, i.e., the transparent auxiliary electrode 150 is formed to have a considerably large line width, a line resistance of the transparent auxiliary electrode 150 can be sufficiently low. For example, if the transparent auxiliary electrode 150 is formed of IZO and the transparent auxiliary electrode 150 has a width W of 550 μm and a thickness of 1000 Å, the transparent auxiliary electrode 150 in the first see-through region T/A1 may have a line resistance of 30 Ω per unit length. That is, the line resistance of the transparent auxiliary electrode 150 is similar to the resistance of the metal auxiliary electrode. Therefore, if the transparent auxiliary electrode 150 is used, a wide see-through region can be formed. Thus, an aperture ratio of the see-through region can be increased as compared with a general auxiliary electrode. Therefore, transmissivity is increased.

Meanwhile, the transparent auxiliary electrode 150 is disposed on the planarization layer 161 so as to cover the see-through regions T/A1 and T/A2. Thus, a parasitic capacitance which may be generated between the transparent auxiliary electrode 150 and the lines under the planarization layer 161 can be effectively reduced.

Figure 3:
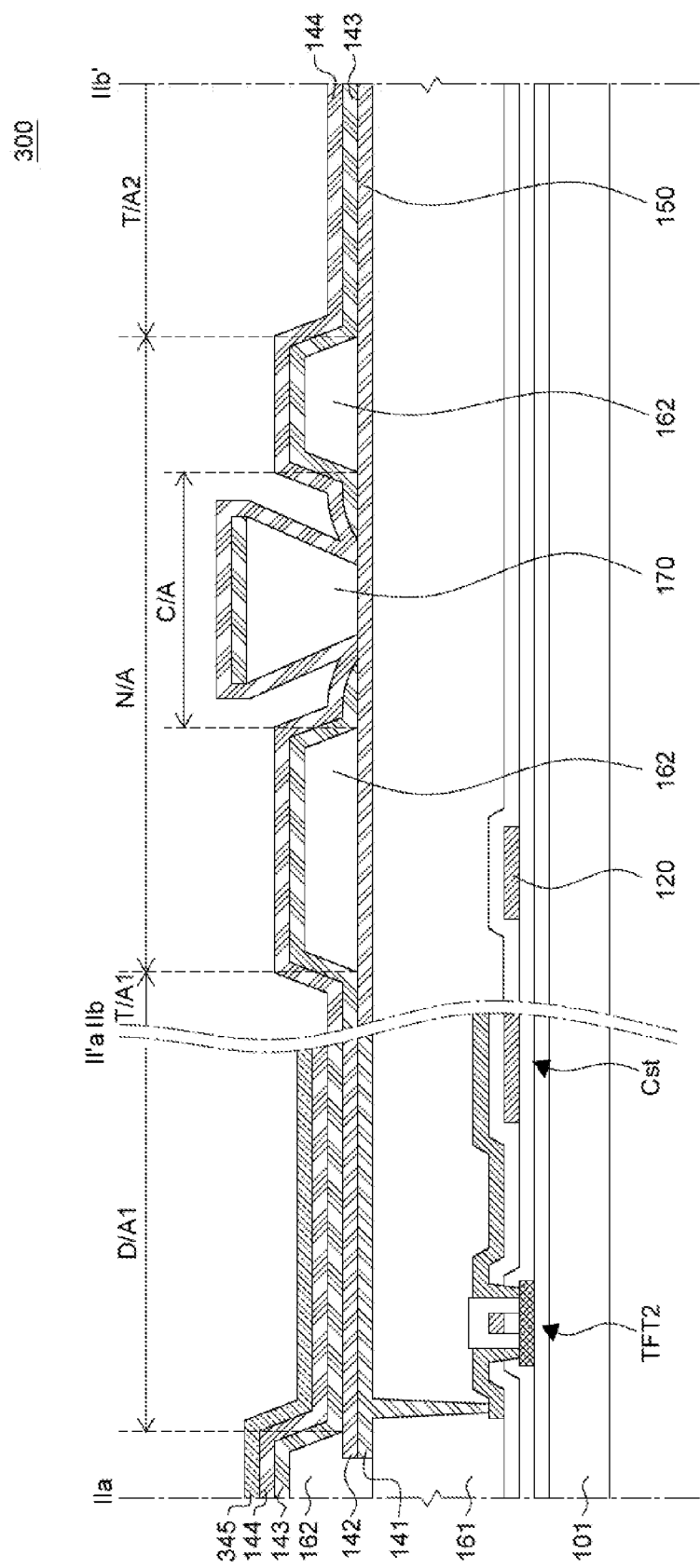
FIG. 3 is a cross-sectional view taken along the line IIa-IIa' and the line IIb-IIb' of FIG. 1 according to another exemplary embodiment of the present disclosure.

FIG. 3 is a cross-sectional view taken along the line IIa-IIa' and the line IIb-IIb' of FIG. 1 according to another exemplary embodiment of the present disclosure. A see-through organic light emitting display device 300 illustrated in FIG. 3 is substantially the same as the see-through organic light emitting display device 100 illustrated in FIG. 1 and FIG. 2 except that a translucent cathode 345 is further provided on the transparent cathode 144 in the light emitting region D/A1. Therefore, redundant descriptions thereof will be omitted merely for the sake of brevity.

Referring to FIG. 3, the translucent cathode 345 is disposed on the transparent cathode 144 only in the light emitting region D/A1 so as to be in contact with the transparent cathode 144. Herein, the translucent cathode 345 is configured to apply a voltage to the organic light emitting layer 143 together with the transparent cathode 144. Further, the translucent cathode 345 can further suppress a voltage drop in the cathode which may occur when a cathode is formed of only the transparent cathode 144 which is a transparent electrode.

The translucent cathode 345 is formed of a metallic material having a very small thickness and a low work function. Examples of a metal to be used as the translucent cathode 345 may include silver (Ag), titanium (Ti), aluminum (Al), molybdenum (Mo), or an alloy of silver (Ag) and magnesium (Mg).

Since the translucent cathode 345 is formed of a metallic material, it has lower transmissivity to light than the transparent cathode 144 and also has poorer transparency than the transparent cathode 144. Therefore, even if the translucent cathode 345 as a metallic material is formed to have small thickness, a relatively low transmissivity, for example, a transmissivity of about 55%, can be obtained. Therefore, the translucent cathode 345 is disposed only in the light emitting region D/A1 but not in the see-through regions T/A1 and T/A2 in order to maintain high transmissivity in the see-through regions T/A1 and T/A2.

In the see-through organic light emitting display device 300 according to another exemplary embodiment of the present disclosure, the translucent cathode 345 as a metallic material is disposed on the transparent cathode 144 having a high transmissivity and a high resistivity. Since the translucent cathode 345 is disposed on the transparent cathode 144, a line resistance of the transparent cathode 144 can be effectively decreased. Thus, a voltage drop caused by the transparent cathode 144 and the translucent cathode 345 can be effectively compensated.

Further, since the translucent cathode 345 has a lower transmissivity than the transparent cathode 144, the translucent cathode 345 is disposed only in the light emitting region D/A1, so that a maximum transmissivity in the see-through regions T/A1 and T/A2 of the see-through organic light emitting display device 300 can be obtained and a voltage drop caused by the transparent cathode 144 and the translucent cathode 345 can also be effectively reduced.

Herein, since the translucent cathode 345 is not disposed in a see-through region, it does not need to have an excellent transparency.

Figure 4:
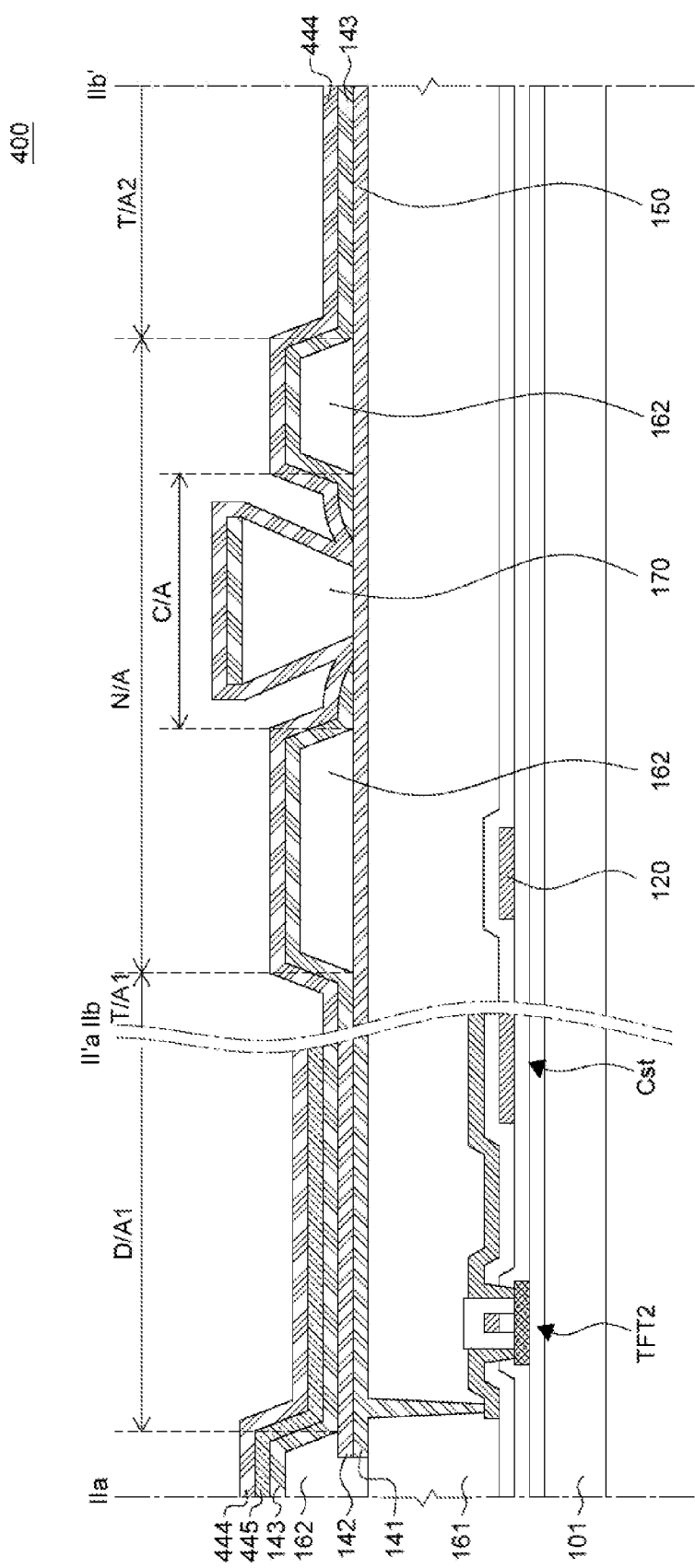
FIG. 4 is a cross-sectional view taken along the line IIa-IIa' and the line IIb-IIb' of FIG. 1 according to yet another exemplary embodiment of the present disclosure.

FIG. 4 is a cross-sectional view taken along the line IIa-IIa' and the line IIb-IIb' of FIG. 1 according to yet another exemplary embodiment of the present disclosure. A see-through organic light emitting display device 400 illustrated in FIG. 431 is substantially the same as the see-through organic light emitting display device 300 illustrated in FIG. 3 except that a transparent cathode 444 is disposed on a translucent cathode 445 in the light emitting region D/A1. Therefore, redundant descriptions thereof will be omitted merely for the sake of brevity.

Referring to FIG. 4, the transparent cathode 444 is disposed on the translucent cathode 445 so as to be in contact with the translucent cathode 445. The transparent cathode 444 is also configured to apply a voltage to the organic light emitting layer 143. The transparent cathode 444 may be formed of a transparent conductive material such as indium zinc oxide (IZO). Herein, the transparent cathode 444 having a transmissivity means that the transparent cathode 444 has a transmissivity of 90% or more. The exemplary transmissivity of the transparent cathode can be applied to other embodiments.

Herein, the translucent cathode 445 disposed between the transparent cathode 444 and the organic light emitting layer 143 may assist electrons supplied from the transparent cathode 444 to be readily injected into the organic light emitting layer 143. In order to suppress a decrease in transmissivity in the see-through regions T/A1 and T/A2, the translucent cathode 445 may be disposed only in the light emitting regions D/A1 and D/A2.

Referring to FIG. 4, the transparent cathode 444 is in contact with the transparent auxiliary electrode 150 disposed in the see-through regions T/A1 and T/A2 and the non-display region N/A. Considering that the partition wall 170 is disposed on the transparent auxiliary electrode 150, the transparent cathode 444 needs to be formed of a material having a high step coverage in order for the transparent cathode 444 to be in contact with the transparent auxiliary electrode 150. That is, indium zinc oxide (IZO) as the transparent cathode 444 has a step coverage sufficient to be formed on the translucent cathode 445, the transparent auxiliary electrode 150, and the partition wall 170 while being in contact with the transparent auxiliary electrode 150.

Considering the thickness of the see-through organic light emitting display device 400 and a resistivity required for the transparent cathode 444, the transparent cathode 444 may be disposed so as to have a thickness of 1000 to 1500 Å. The exemplary thickness of the transparent cathode can be applied to other embodiments.

In the see-through organic light emitting display device 400 according to yet another exemplary embodiment of the present disclosure, the transparent cathode 444 is disposed in all of the see-through regions T/A1 and T/A2 and the light emitting region D/A1. Therefore, even if the transparent cathode 444 having a high transmissivity is disposed in the see-through regions T/A1 and T/A2, the see-through regions T/A1 and T/A2 can transmit light incident from the outside due to a high transmissivity of the transparent cathode 444.

Figure 5A:
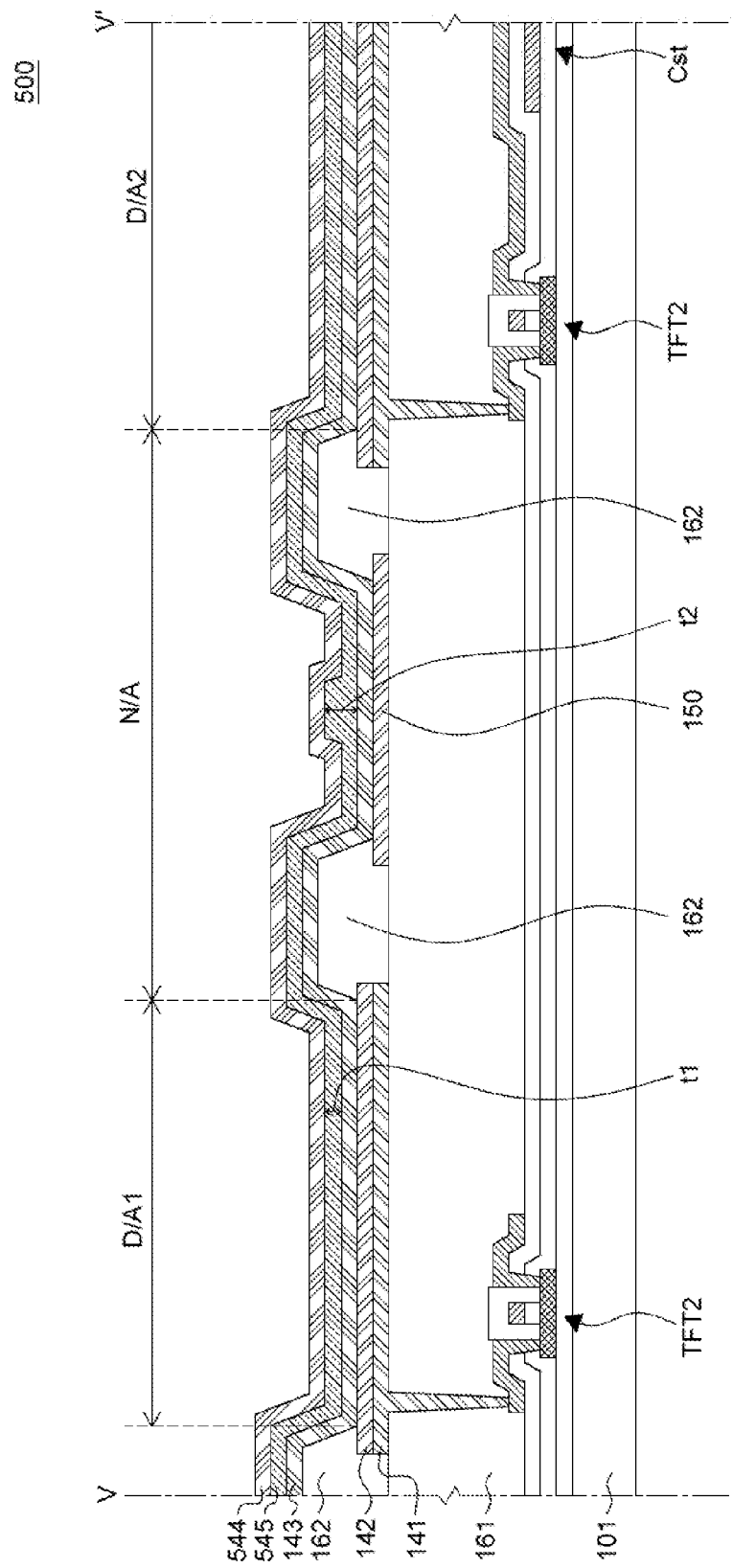
FIG. 5A and FIG. SB are cross-sectional views taken along a line V-V' of FIG. 1 according to still another exemplary embodiment of the present disclosure.
Figure 5B:
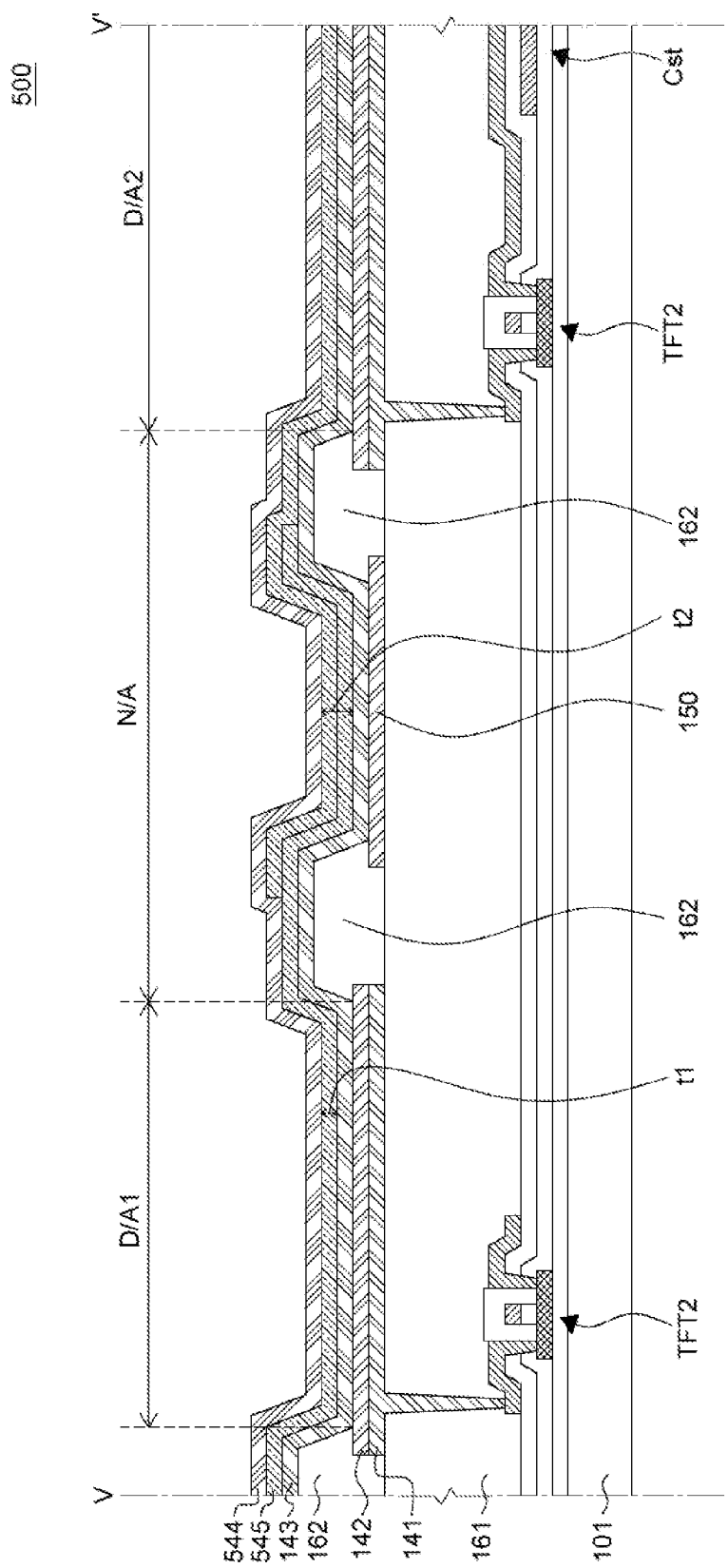

FIG. 5A and FIG. SB are cross-sectional views taken along a line V-V' of FIG. 1 according to still another exemplary embodiment of the present disclosure. FIG. 5A and FIG. SB are cross-sectional views of the light emitting regions D/A1 and D/A2 and the non-display region N/A. Further, a see-through organic light emitting display device 500 illustrated in FIG. SA and FIG. 5B is substantially the same as the see-through organic light emitting display device 400 illustrated in FIG. 4 except that thicknesses of a transparent cathode 544 and a translucent cathode 545 in the non-display region N/A are different thicknesses thereof in the light emitting regions D/A1 and D/A2. Therefore, redundant descriptions thereof will be omitted for the sake of brevity.

Referring to FIG. 5A, the translucent cathode 545 may have a first thickness t1 in the first light emitting region D/A1 and the second light emitting region D/A2, and a second thickness t2 in the non-display region N/A between the first light emitting region D/A1 and the second light emitting region ID/A2. Herein, the second thickness t2 is greater than the first thickness t1. For example, the first thickness t1 may be about 100 Å to about 200 Å, and the second thickness t2 may be about 200 Å to about 400 Å. The exemplary thickness of the translucent cathode can be applied to other embodiments.

Referring to FIG. SB, in the see-through organic light emitting display device 500 according to still another exemplary embodiment of the present disclosure, the translucent cathode 545 has the first thickness t1 in the first light emitting region D/A1 and the second light emitting region D/A2 and the second thickness t2 in the non-display region N/A between the first light emitting region D/A1 and the second light emitting region D/A2. To be specific, the translucent cathode 545 is disposed so as to be overlapped in part in the non-display region N/A, and the second thickness t2 of the translucent cathode 545 becomes greater than the first thickness t1. That is, the translucent cathode 545 may be overlapped perpendicularly to the transparent auxiliary electrode 150 in a part where the translucent cathode 545 is disposed so as to have the second thickness t2.

In the see-through organic light emitting display device 500 according to still another exemplary embodiment of the present disclosure, since the translucent cathode 545 has the second thickness t2 greater than the first thickness t1 in as many regions as possible between the first light emitting region D/A1 and the second light emitting region D/A2, line resistances of the transparent cathode 544 and the translucent cathode 545 can be further decreased. Therefore, it is possible to further compensate for voltage drops in the transparent cathode 544 and the translucent cathode 545.

Further, in the see-through organic light emitting display device 500 according to still another exemplary embodiment of the present disclosure, a distance between the translucent cathode 545 and the transparent anode 142 may be an optical distance of a microcavity. For example, a distance d between the translucent cathode 545 and the transparent anode 142 may satisfy a condition of $m\lambda = 2nd$. Herein, m represents an order, $\lambda$ represents a wavelength of a light emitted from each light emitting region, and n represents an average refractive index of a plurality of organic layers positioned between the translucent cathode 545 and the reflection layer 141 in each light emitting region. Since the distance between the translucent cathode 545 and the transparent anode 142 is an optical distance of a microcavity, reflection repeatedly occurs between translucent cathode 545 and the transparent anode 142. Thus, efficiency of light at a peak-wavelength caused by constructive interference is increased.

Figure 6:
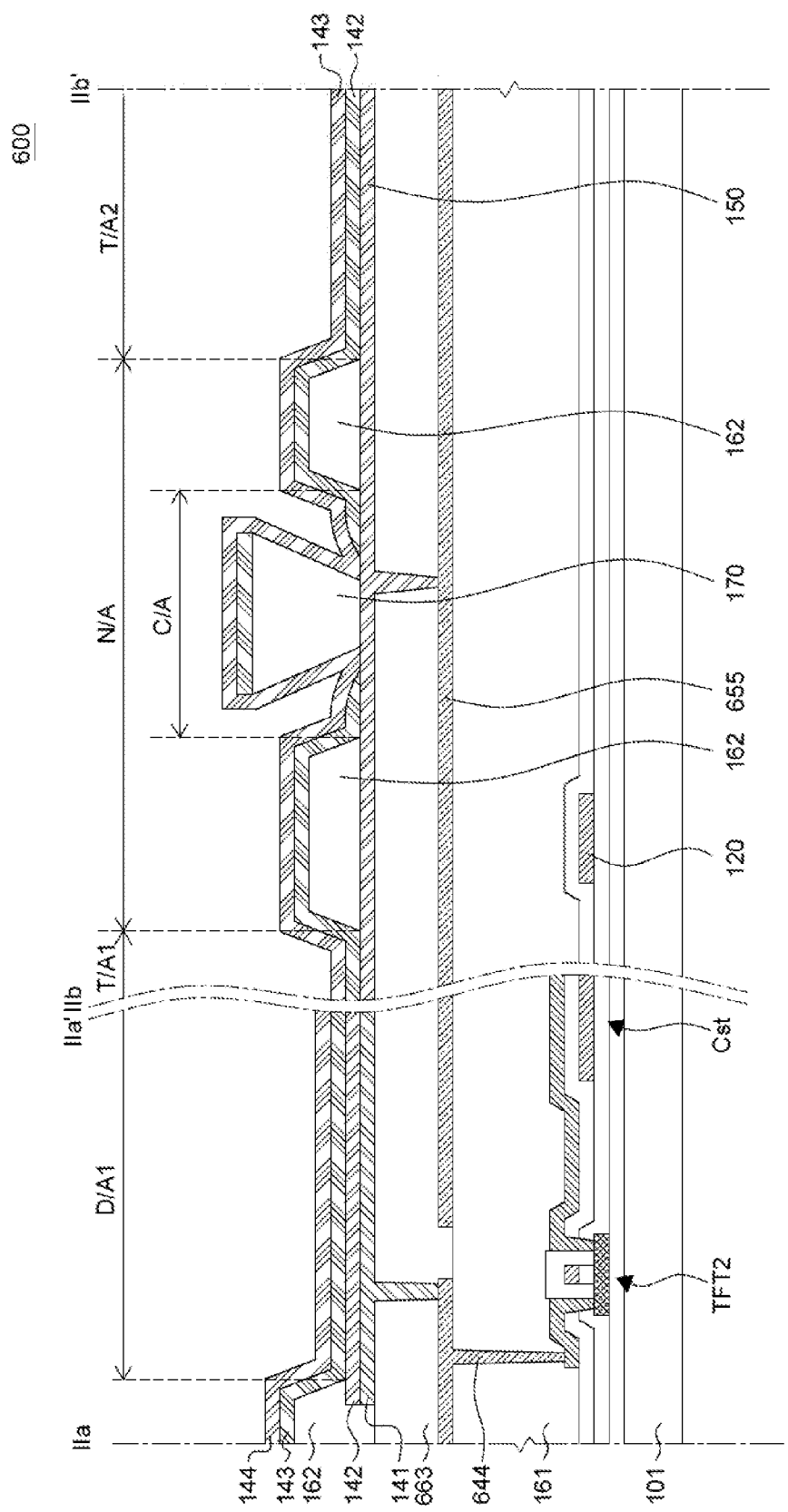
FIG. 6 is a schematic cross-sectional view provided to describe a see-through organic light emitting display device according to still another exemplary embodiment of the present disclosure.

FIG. 6 is a schematic cross-sectional view provided to describe a see-through organic light emitting display device according to still another exemplary embodiment of the present disclosure. For convenience in explanation, FIG. 6 illustrates a part of each of the first light emitting region D/A1, the first see-through region T/A1, the second see-through region T/A2, and the non-display region N/A of FIG. 1. A see-through organic light emitting display device 600 illustrated in FIG. 6 is substantially the same as the see-through organic light emitting display device 100 illustrated in FIG. 1 and FIG. 2 except that a dielectric layer 663 disposed under the transparent auxiliary electrode 150 and a bottom transparent auxiliary electrode 655 disposed under the dielectric layer 663 are further provided. Therefore, redundant descriptions thereof will be omitted.

Referring to FIG. 6, the dielectric layer 663 is disposed under the transparent auxiliary electrode 150. The dielectric layer 663 is disposed on the planarization layer 161 and may be formed of substantially the same transparent organic insulation material as the planarization layer 161. For example, the planarization layer 161 and the dielectric layer 663 may be formed of any one or more materials of polyacrylates resin, epoxy resin, phenolic resin, polyamides resin, polyimides resin, unsaturated polyesters resin, poly-phenylenethers resin, poly-phenylenesulfides resin, and benzocyclobutene, but are not limited thereto, and may be formed of various organic insulation materials.

A connection electrode 644 is disposed between the dielectric layer 663 and the planarization layer 161. The connection electrode 644 is electrically connected with the second thin film transistor TFT2 through a contact hole formed in the planarization layer 161 and electrically connected with the reflection layer 141 in the first light emitting region D/A1 through a contact hole formed in dielectric layer 663.

The bottom transparent auxiliary electrode 655 is disposed under the dielectric layer 663 so as to be separated from the connection electrode 644. The bottom transparent auxiliary electrode 655 under the reflection layer 141 is overlapped in part with the reflection layer 141. That is, the bottom transparent auxiliary electrode 655 is overlapped with not only the first see-through region T/A1 but also the non-display region N/A and the first light emitting region D/A1. Thus, an area of the bottom transparent auxiliary electrode 655 may be greater than an area of the transparent auxiliary electrode 150.

Each of the bottom transparent auxiliary electrode 655 and the connection electrode 644 may be formed of a transparent conductive oxide. In this case, even if the bottom transparent auxiliary electrode 655 is disposed in the first see-through region T/A1 and the second see-through region T/A2, a decrease in transmissivity caused by the bottom transparent auxiliary electrode 655 may substantially not occur. In some exemplary embodiments, all of the bottom transparent auxiliary electrode 655, the connection electrode 644, the transparent anode 142, the transparent auxiliary electrode 150, and the transparent cathode 144 may be formed of the same transparent conductive oxide.

Referring to FIG. 6, the bottom transparent auxiliary electrode 655 is electrically connected with the transparent auxiliary electrode 150 disposed on the dielectric layer 663. For example, the bottom transparent auxiliary electrode 655 is electrically connected with the transparent auxiliary electrode 150 in the non-display region N/A through the contact hole formed in the dielectric layer 663. For example, as illustrated in FIG. 6, the bottom transparent auxiliary electrode 655 and the transparent auxiliary electrode 150 are connected with each other in the contact region C/A.

As described above, since the bottom transparent auxiliary electrode 655 is connected with the transparent auxiliary electrode 150 and the transparent auxiliary electrode 150 is connected with the transparent cathode 144 in the contact region C/A, a line resistance of the transparent cathode 144 is decreased by the transparent auxiliary electrode 150 and the bottom transparent auxiliary electrode 655. In particular, since the bottom transparent auxiliary electrode 655 has a greater area than the transparent auxiliary electrode 150, a total resistance of the transparent cathode 144 can be further decreased as compared with a case where only the transparent auxiliary electrode 150 and the cathode 144 are connected with each other. That is, the bottom transparent auxiliary electrode 655 is overlapped with the transparent anode, and the bottom transparent auxiliary electrode 655 is electrically insulated from the transparent anode by the dielectric layer.

Further, since the bottom transparent auxiliary electrode 655 is formed of a transparent conductive oxide in the same manner as the transparent auxiliary electrode 150, even if the bottom transparent auxiliary electrode 655 is overlapped with the first see-through region T/A1 and the second see-through region T/A2, a decrease in transmissivity caused by the bottom transparent auxiliary electrode 655 can be minimized. Thus, the see-through organic light emitting display device 600 has a high transmissivity and a voltage drop in the see-through organic light emitting display device 600 can be minimized.

Figure 7A:
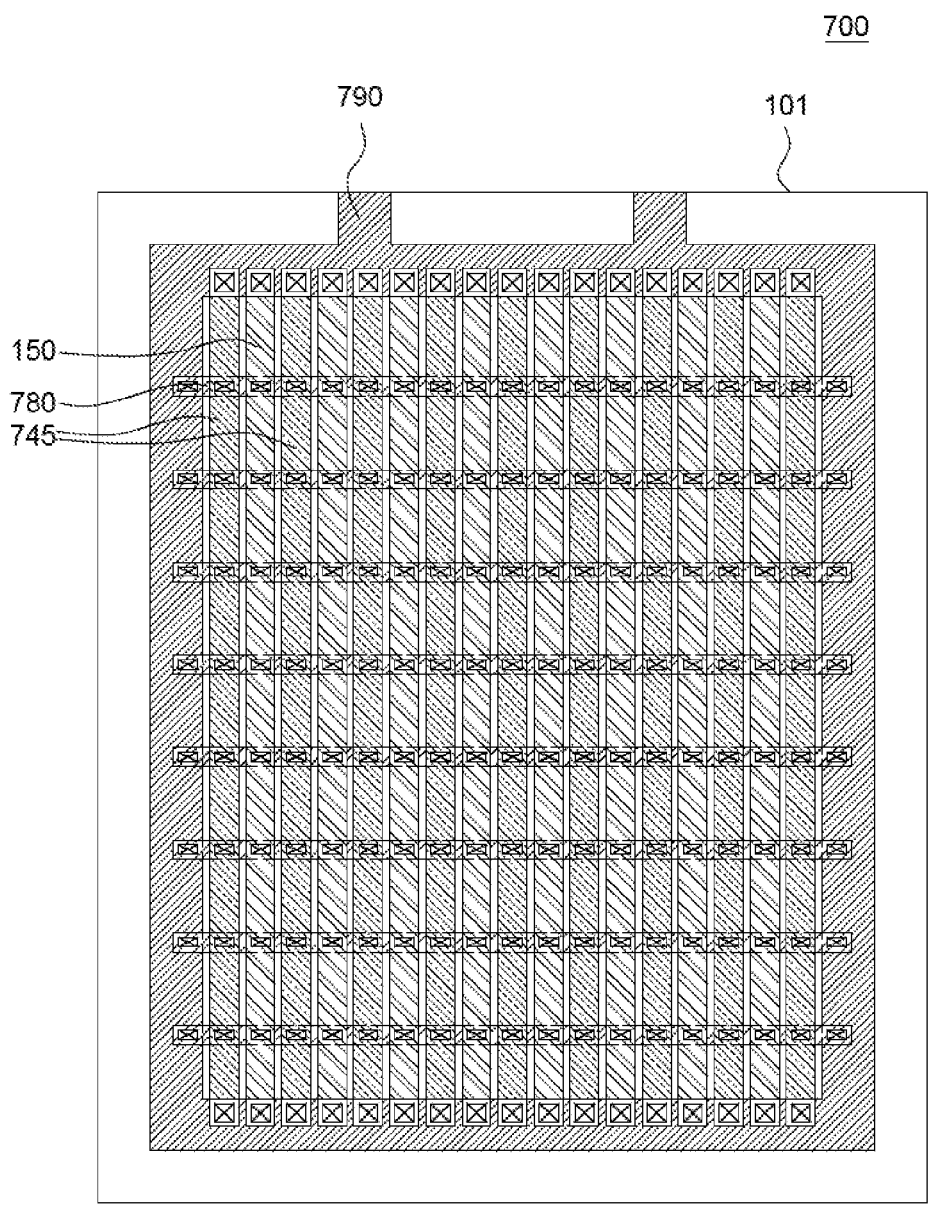
FIG. 7A and FIG. 7B are schematic plan views provided to describe a see-through organic light emitting display device according to still another exemplary embodiment of the present disclosure.
Figure 7B:
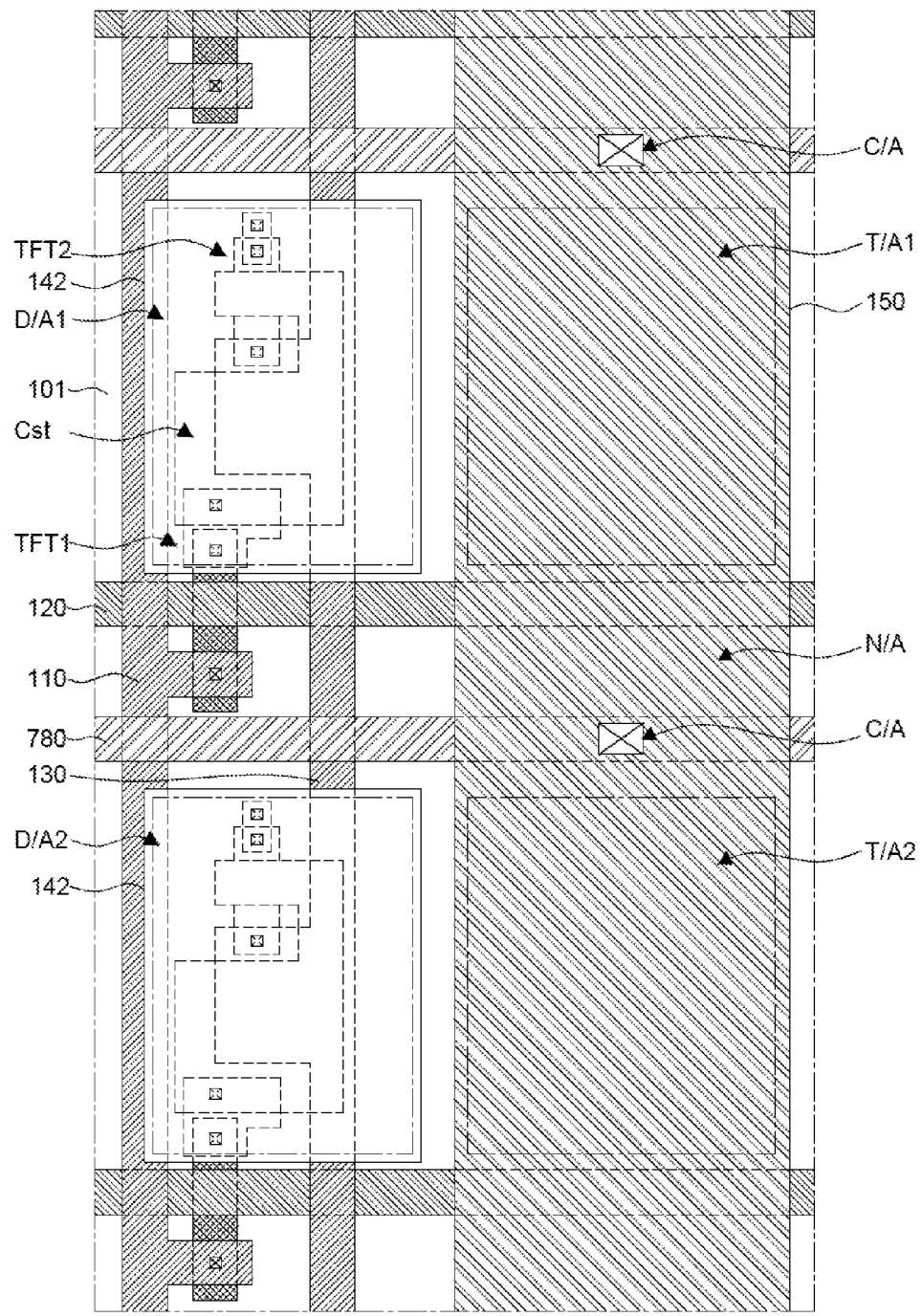

FIG. 7A and FIG. 7B are schematic plan views provided to describe a see-through organic light emitting display device according to still another exemplary embodiment of the present disclosure. A see-through organic light emitting display device 700 illustrated in FIG. 7A and FIG. 7B is substantially the same as the see-through organic light emitting display device 100 illustrated in FIG. 1 except that a voltage supply pad 790 and an opaque auxiliary electrode 780 electrically connected with the transparent auxiliary electrode 150 are further provided and the opaque auxiliary electrode 780 is perpendicularly overlapped with a translucent cathode 745. Therefore, redundant description thereof will be omitted. For convenience in explanation, FIG. 7A only illustrates the substrate 101, the transparent auxiliary electrode 150, the opaque auxiliary electrode 780, the translucent cathode 745, and the voltage supply pad 790.

Referring to FIG. 7A, the see-through organic light emitting display device 700 according to still another exemplary embodiment of the present disclosure further includes the voltage supply pad 790. To be specific, the voltage supply pad 790 is disposed on the substrate 101 so as to surround a periphery of a display region A/A. A region configured to surround the periphery of the display region A/A may be defined as a peripheral region of the see-through organic light emitting display device 700. FIG. 7A illustrates that the voltage supply pad 790 surrounds the overall periphery of the display region A/A, and the voltage supply pad 790 may be disposed only in a part of the periphery of the display region A/A. For example, the voltage supply pad 790 may be disposed only in an upper periphery of the display area A/A. Herein, a width of the voltage supply pad 790 may be about 500 μm to about 1000 μm.

The translucent cathode 745 is disposed so as to be perpendicular to the opaque auxiliary electrode 780 and parallel to the transparent auxiliary electrode 150. FIG. 7A illustrates that the translucent cathode 745 is separated from the transparent auxiliary electrode 150 in an alternating manner without being overlapped with the transparent auxiliary electrode 150. To be specific, the translucent cathode 745 is disposed so as to cover a light emitting region and the transparent auxiliary electrode 150 is disposed to cover at least a see-through region. Therefore, the translucent cathode 745 and the transparent auxiliary electrode 150 may be disposed to be parallel to each other with a space therebetween.

Further, as can be understood from FIG. 7A, the transparent cathode may be arranged in all of the light emitting region and the see-through region. Therefore, the transparent cathode may be electrically connected with the translucent cathode 745 and the transparent auxiliary electrode 150. That is, the transparent cathode and the translucent cathode 745 are electrically connected with the transparent auxiliary electrode 150. Thus, a total cathode resistance of the see-through organic light emitting display device can be decreased.

In some exemplary embodiments, the translucent cathode 745 may be disposed so as to be overlapped with the transparent auxiliary electrode 150. That is, if the transparent auxiliary electrode 150 is disposed so as to cover the see-through region and the light emitting region, it can be overlapped with the translucent cathode 745 disposed in the light emitting region.

The voltage supply pad 790 may be electrically connected with the transparent auxiliary electrode 150, the translucent cathode 745, and the opaque auxiliary electrode 780. Further, the voltage supply pad 790 may also be electrically connected with the transparent cathode. To be more specific, the voltage supply pad 790 may be electrically connected with the transparent cathode and the translucent cathode 745 through the contact hole and may supply a common voltage VSS. Further, the voltage supply pad 790 is electrically connected with the transparent auxiliary electrode 150 and the opaque auxiliary electrode 780 through the contact hole. Therefore, the transparent auxiliary electrode 150 and the opaque auxiliary electrode 780 are also electrically connected with the transparent cathode and the translucent cathode 745, so that a total resistance of the transparent cathode and the translucent cathode 745 can be greatly decreased. In an organic light emitting display device of the related art, since a voltage supply pad is disposed in the overall edge of a substrate, there is a limit in reducing a bezel region of a see-through organic light emitting display device. Besides, since the voltage supply pad is formed of an opaque metallic material, even when the see-through organic light emitting display device is not operated, the voltage supply pad disposed in the bezel region can be recognized by a user. Thus, this may be aesthetically displeasing for consumers.

In the see-through organic light emitting display device 700 according to still another exemplary embodiment of the present disclosure, since the voltage supply pad 790 may be disposed in only one side of the periphery of the display region A/A on the substrate 110, it is possible to greatly reduced a bezel region and also possible to improve an aesthetic effect by providing a transparent bezel.

Referring to FIG. 7B, the opaque auxiliary electrode 780 electrically connected with the transparent auxiliary electrode 150 is disposed in the non-display region N/A. The opaque auxiliary electrode 780 can be electrically connected with the cathode and can apply the same VSS voltage to the cathode in all of the light emitting regions D/A1 and D/A2.

The opaque auxiliary electrode 780 may be disposed under the transparent auxiliary electrode 150. That is, the opaque auxiliary electrode 780 may be disposed on the same plane as the reflection layer 141 and formed of the same material as the reflection layer 141. That is, since the opaque auxiliary electrode 780 is disposed in the non-display region N/A, transparency is not necessary. Therefore, the opaque auxiliary electrode 780 may be formed of an opaque metal having a relatively low resistance.

The opaque auxiliary electrode 780 can be extended in a direction different from an extension direction of the transparent auxiliary electrode 150. Therefore, the opaque auxiliary electrode 780 and the transparent auxiliary electrode 150 can intersect each other. The opaque auxiliary electrode 780 is connected with the transparent auxiliary electrode 150 in the non-display region N/A. For example, the opaque auxiliary electrode 780 may be in direct contact with the transparent auxiliary electrode 150 in a region where the opaque auxiliary electrode 780 intersects the transparent auxiliary electrode 150. Therefore, since the opaque auxiliary electrode 780 and the transparent auxiliary electrode 150 intersect each other, they may have a substantially mesh-pattern structure. That is, since the respective auxiliary electrodes and the transparent cathode are organically disposed so as to have a specific pattern and electrically connected with each other, it is possible to provide transparency and transmissivity to the see-through organic light emitting display device and also possible to efficiently supply a VSS voltage to the display region A/A.

Further, as illustrated in FIG. 7B, the opaque auxiliary electrode 780 is perpendicularly overlapped with the data line 110 and the VDD line 130. Since a region where the data line 110 and the VDD line 130 are disposed is substantially irrelevant to luminance efficiency of the see-through organic light emitting display device 700, if the opaque auxiliary electrode 780 is disposed so as to be overlapped with the data line 110 and the VDD line 130, it is possible to minimize a decrease in the aperture ratio of the see-through organic light emitting display device 700 caused by disposition of the opaque auxiliary electrode 780 and also possible to decrease a total cathode resistance. However, the opaque auxiliary electrode 780 is not necessarily limited to perpendicularly intersect the data line 110, the VDD line 130, or the transparent auxiliary electrode 150, and can also be disposed at a position that does not interfere with transmissivity.

As described above, since the opaque auxiliary electrode 780 is connected with the transparent auxiliary electrode 150, a voltage drop in the cathode can be further reduced. That is, the opaque auxiliary electrode 780 intersects the transparent auxiliary electrode 150. Further, the opaque auxiliary electrode 780 and the transparent auxiliary electrode 150 are connected with each other in an intersection region where the opaque auxiliary electrode 780 intersects the transparent auxiliary electrode 150 so as to form a mesh pattern. Since the same VSS voltage is supplied to the mesh pattern, all of the cathodes in the respective pixels connected with the mesh pattern are supplied with the same VSS voltage. Thus, a voltage drop in the see-through organic light emitting display device 700 can be reduced more efficiently. Even if an area of the see-through organic light emitting display device 700 is increased, non-uniformity in luminance can be improved.

Figure 8:
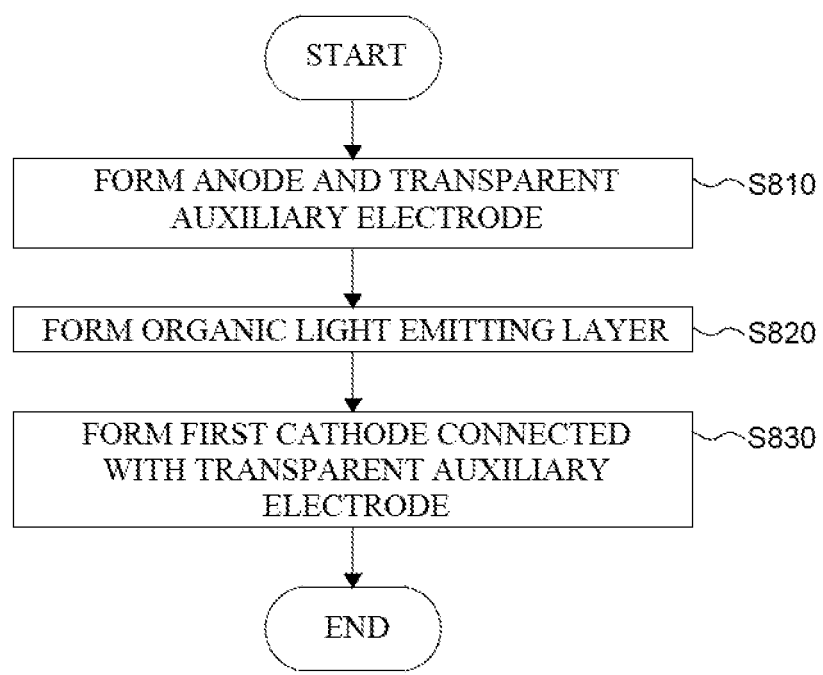
FIG. 8 is a flowchart provided to describe a method for manufacturing a see-through organic light emitting display device according to an exemplary embodiment of the present disclosure.

FIG. 8 is a flowchart provided to describe a method for manufacturing a see-through organic light emitting display device according to an exemplary embodiment of the present disclosure. FIG. 9A to FIG. 9F are schematic cross-sectional views provided to describe the method for manufacturing a see-through organic light emitting display device according to the exemplary embodiment of the present disclosure. In FIG. 9A to FIG. 9E, illustration of a first thin film transistor and a storage capacitor is omitted, and a part of each of the first light emitting region D/A1, the second see-through region T/A2, and the non-display region N/A of FIG. 1 is illustrated.

Referring to FIG. 8, in a method for manufacturing a see-through organic light emitting display device according to an exemplary embodiment of the present disclosure, firstly, a transparent anode and a transparent auxiliary electrode separated from the transparent anode are formed on a substrate including a light emitting region and a see-through region separated from the light emitting region (S810).

Figure 9A:
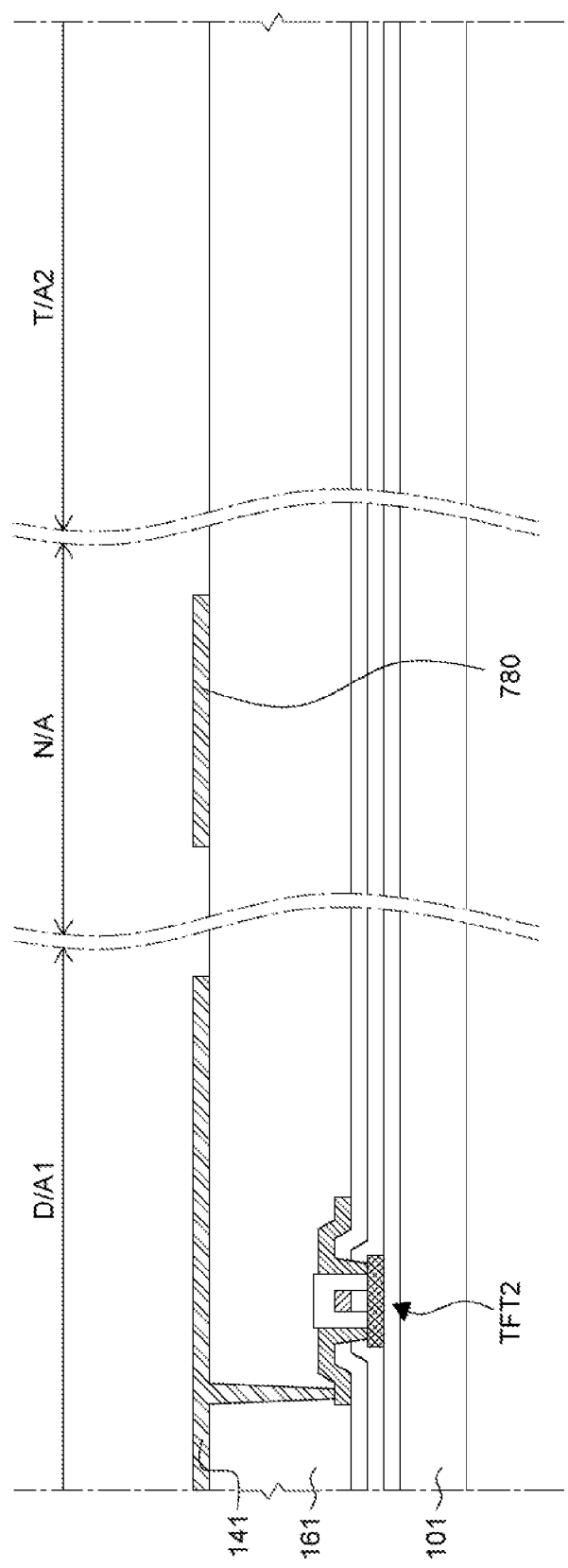
FIG. 9A to FIG. 9F are schematic cross-sectional views provided to describe the method for manufacturing a see-through organic light emitting display device according to the exemplary embodiment of the present disclosure.

Referring to FIG. 9A, a first thin film transistor, a storage capacitor, a second thin film transistor TFT2, a data line, a gate line, and a VDD line are formed on the substrate 101. Then, the planarization layer 161 is formed so as to cover the first thin film transistor, the storage capacitor, the second thin film transistor TFT2, the data line, the gate line, and the VDD line. Thereafter, a contact hole through which the second thin film transistor TFT2 is formed in the planarization layer 161.

The reflection layer 141 connected with the second thin film transistor TFT2 and the opaque auxiliary electrode 780 are formed on the planarization layer 161. For example, a metal layer is formed so as to fill the contact hole of the planarization layer 161. Thereafter, the reflection layer 141 is formed in the first light emitting region D/A1 by patterning the metal layer, and the opaque auxiliary electrode 780 is formed in the non-display region N/A.

Figure 9B:
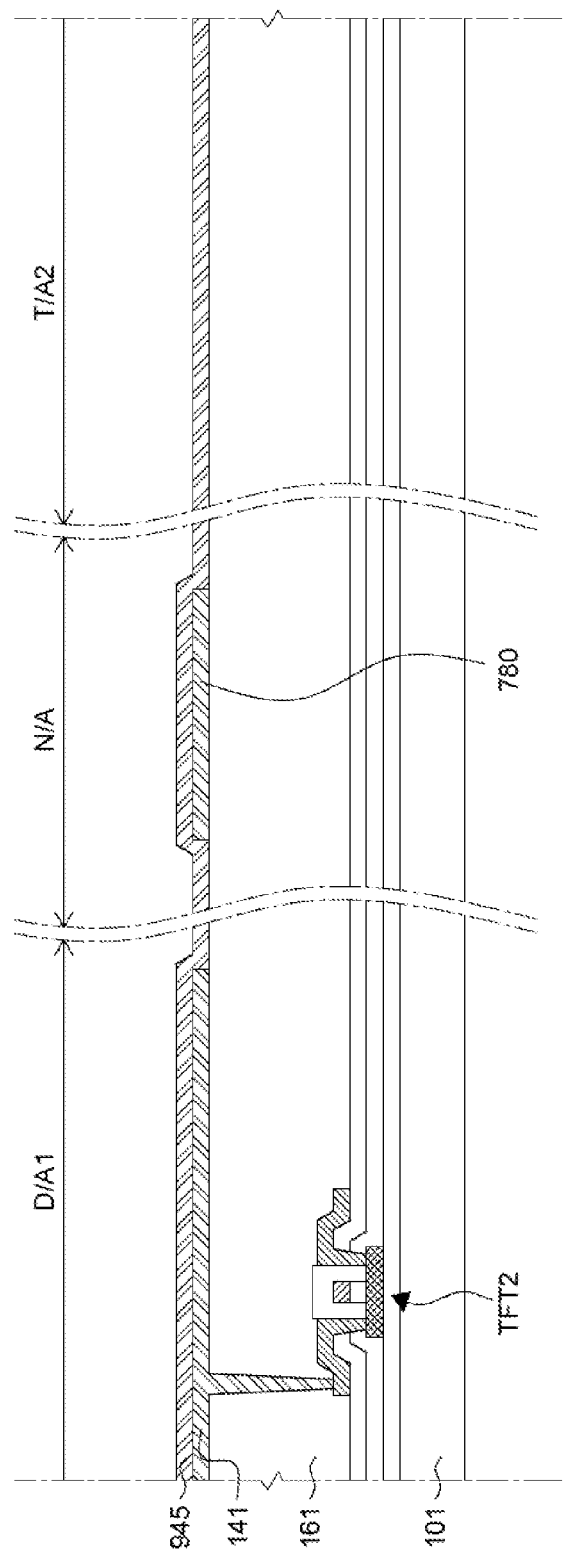

Referring to FIG. 9B, a transparent conductive oxide layer 945 is formed so as to cover the reflection layer 141 and the opaque auxiliary electrode 780. The transparent conductive oxide layer 945 is formed so as to cover the first light emitting region D/A1, the second see-through region T/A2, and the non-display region N/A. For example, the transparent conductive oxide layer 945 may be formed by a deposition process such as sputtering, atomic layer deposition (ALD), and etc. However, the method for forming the transparent conductive oxide layer 945 is not limited thereto, and the transparent conductive oxide layer 945 may be formed by a printing process or a coating process.

Figure 9C:
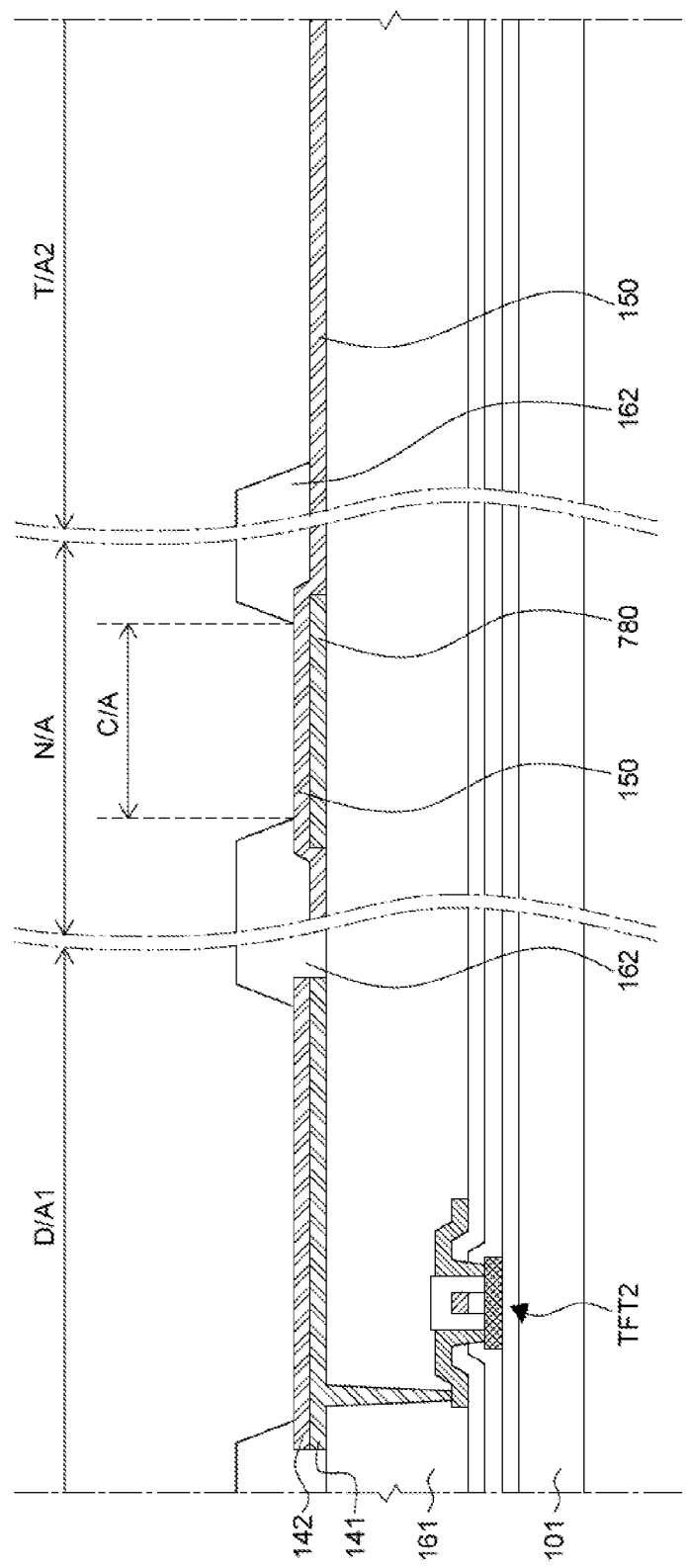

Referring to FIG. 9C, by patterning the transparent conductive oxide layer 945, the transparent auxiliary electrode 150 and the transparent anode 142 separated from the transparent auxiliary electrode 150 and disposed on the reflection layer 141 are formed. For example, by performing a photolithography process using a mask through which a region where the transparent anode 142 and the transparent auxiliary electrode 150 are formed, the transparent anode 142 and the transparent auxiliary electrode 150 may be formed.

Then, the bank 162 is formed so as to cover the transparent anode 142 and the transparent auxiliary electrode 150, and an opening is formed by removing a part of the bank 162. Through the opening, the top surface of the transparent anode 142 is exposed in the first light emitting region D/A1 and the top surface of the transparent auxiliary electrode 150 is exposed in the second see-through region T/A2 and the contact region C/A. For example, the opening may be formed by a photolithography process using a mask through which the first light emitting region D/A1, the second see-through region T/A2, and the contact region C/A are exposed.

Then, an organic light emitting layer is formed on the transparent anode (S820).

Figure 9D:
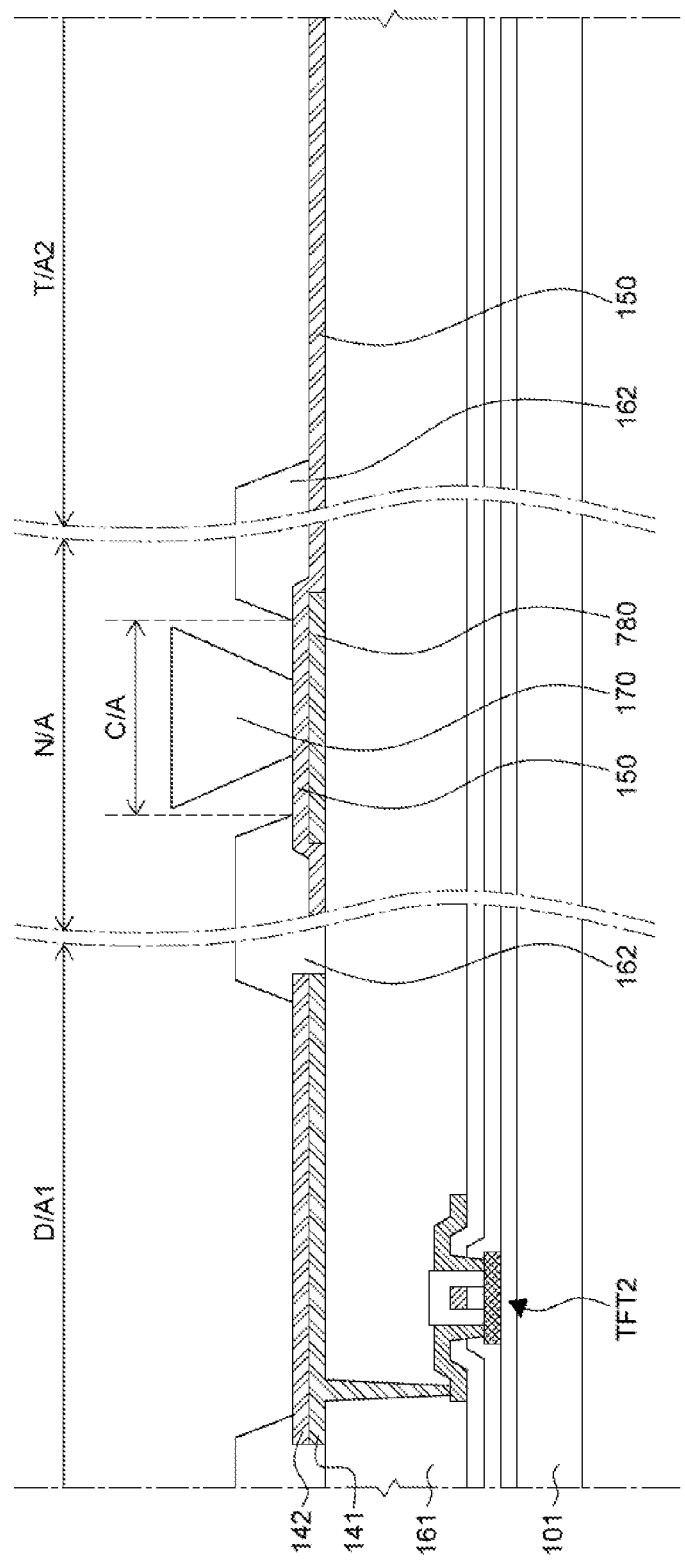

Referring to FIG. 9D, the partition wall 170 is formed on the transparent auxiliary electrode 150 exposed in the contact region C/A of the non-display region N/A. As described above, the partition wall 170 may be formed to have a reverse-taper shape. The partition wall 170 may be formed using a negative photoresist. For example, the negative photoresist is coated so as to cover the non-display region N/A. Then, the negative photoresist is partially exposed to light and developed, so that the partition wall 170 having a reverse-taper shape may be formed. The reverse-taper shape of the partition wall 170 may be changed by regulating an exposure temperature and a bake temperature during manufacturing.

Figure 9E:
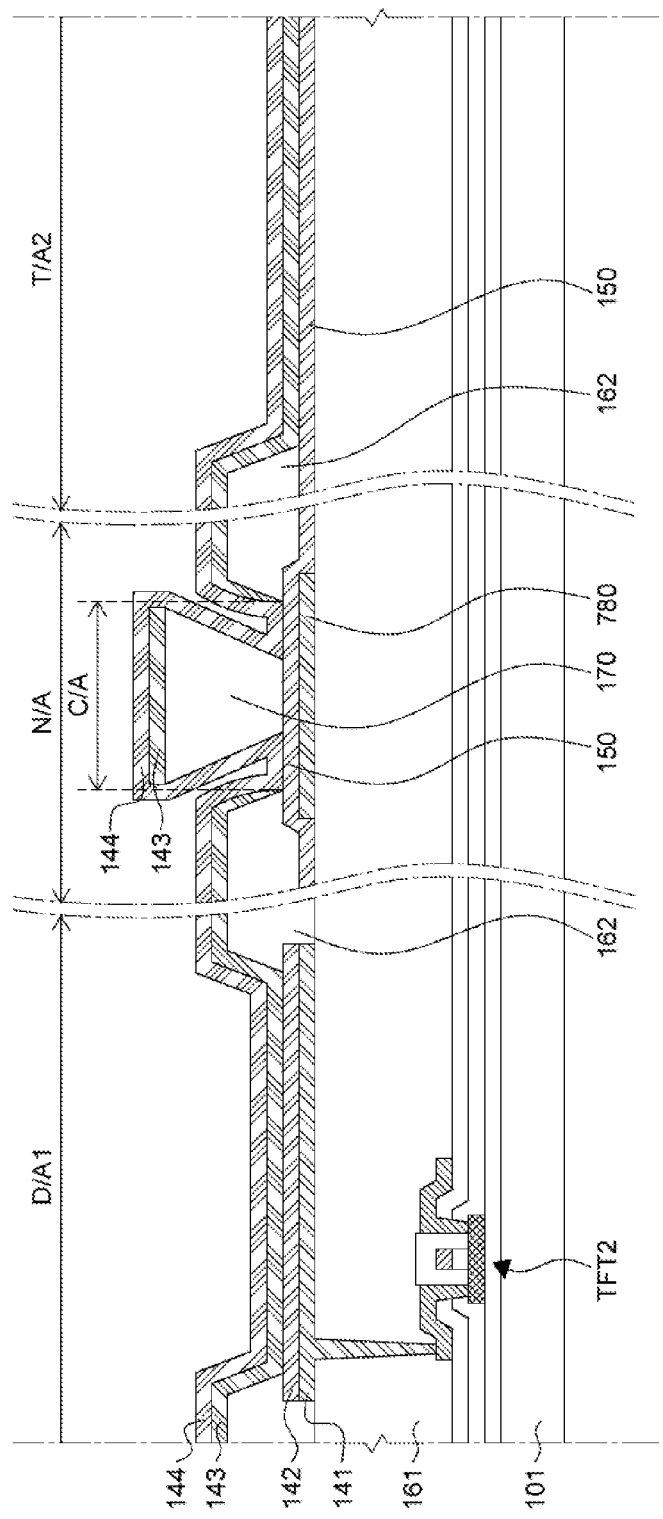

Referring to FIG. 9E, the organic light emitting layer 143 is formed on the exposed transparent anode 142. For example, the organic light emitting layer 143 is formed on the transparent anode 142 in the first light emitting region D/A1, on the transparent auxiliary electrode 150 in the second see-through region T/A2, and on the top surfaces of the bank 162 and the partition wall 170 in the non-display region N/A. The method for forming the organic light emitting layer 143 is not particularly limited. For example, the organic light emitting layer 143 can be formed by a front-surface deposition method in which an organic substance is vaporized and then deposited. However, the method for forming the organic light emitting layer 143 is not limited thereto. The organic light emitting layer 143 can be obtained by a mask-free process such as LITI (Laser Induced Thermal Imaging), LIPS (Laser Induced Patternwise Sublimation), Soluble Printing, etc.

Then, the transparent cathode 144 is formed on the organic light emitting layer 143 (S830). The transparent cathode 144 is formed so as to cover all of the organic light emitting layer 143, the bank 162, the transparent auxiliary electrode 150, and the partition wall 170. The transparent cathode 144 may be formed by a deposition process such as sputtering, ALD, etc. As described above, since a transparent conductive oxide has a high step coverage, the transparent cathode 144 may be formed so as to cover all of the top surface of the bank 162, the side surface of the bank 162, the side surface of the partition wall 170, and the top surface of the partition wall 170 in the non-display region N/A. Thus, the transparent auxiliary electrode 150 exposed between the side surface of the partition wall 170 and the side surface of the bank 162 is brought into contact with the transparent cathode 144. As a result, the transparent cathode 144 electrically connected with the transparent auxiliary electrode 150 is formed.

Then, the translucent cathode 145 may be formed on the transparent cathode 144.

Figure 9F:
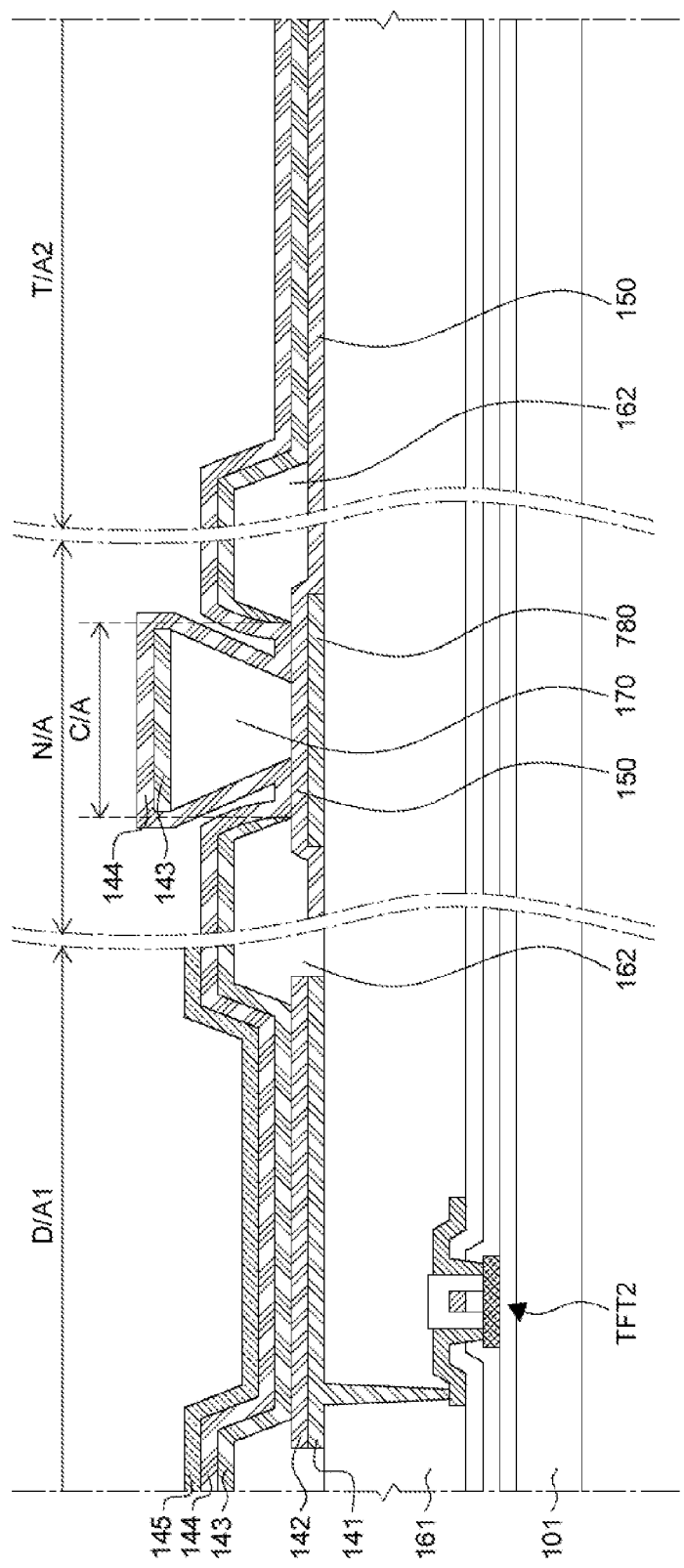

Referring to FIG. 9F, the translucent cathode 145 is formed on the transparent cathode 144 in the light emitting region D/A1. Herein, since the translucent cathode 145 is formed of a metallic material (for example, silver (Ag), titanium (Ti), aluminum (Al), molybdenum (Mo), or an alloy of silver (Ag) and magnesium (Mg)) having very small thickness and a low work function, the translucent cathode 145 has a lower transmissivity to light than the transparent cathode 144. Therefore, even if the translucent cathode 145 formed of a metallic material has a small thickness, the desired transmissivity cannot be achieved. Therefore, the translucent cathode 145 is disposed only in the light emitting region D/A1 but not disposed in the see-through regions T/A1 and T/A2 in order to obtain transmissivity in the see-through regions T/A1 and T/A2.

Although not illustrated in FIG. 9A to FIG. 9F, the translucent cathode 145 may be formed earlier than the transparent cathode 144 in the light emitting region D/A1 and thus may be disposed under the transparent cathode 144. In this case, the translucent cathode 145 disposed between the transparent cathode 444 and the organic light emitting layer 143 can assist electrons supplied from the transparent cathode 144 to be readily injected into the organic light emitting layer 143. However, in order to suppress a decrease in transmissivity in the see-through regions T/A1 and T/A2, the translucent cathode 145 may be disposed only in the light emitting regions D/A1 and D/A2.

Further, although not illustrated in FIG. 9A to FIG. 9F, a bottom transparent auxiliary electrode and a dielectric layer may be further formed under the transparent auxiliary electrode. For example, a transparent conductive oxide layer may be formed on the planarization layer so as to be connected with the second thin film transistor, and the bottom transparent auxiliary electrode and a connection electrode may be formed by patterning the transparent conductive oxide layer. Then, the dielectric layer may be formed so as to cover the bottom transparent auxiliary electrode and the connection electrode, and a first contact hole through which a part of the connection electrode is exposed in the light emitting region and a second contact hole through which a part of the transparent auxiliary electrode is exposed in the non-display region are formed in the dielectric layer. Then, a transparent anode connected with the connection electrode through the first contact hole and a transparent auxiliary electrode connected with the bottom transparent auxiliary electrode through the second contact hole may be formed. In this case, all of the bottom transparent auxiliary electrode, the transparent anode, the transparent auxiliary electrode, and the cathode may be formed of the same transparent conductive oxide.

As described above, the method for manufacturing a see-through organic light emitting display device according to an exemplary embodiment of the present disclosure can form the transparent anode 142 and the transparent auxiliary electrode 150 at the same time by a patterning process. Thus, an additional process for forming the transparent auxiliary electrode 150 is not necessary. Since the transparent auxiliary electrode 150 can be formed by modifying a shape of a mask used in the patterning process, the transparent auxiliary electrode 150 can be easily formed.

Figure 10:
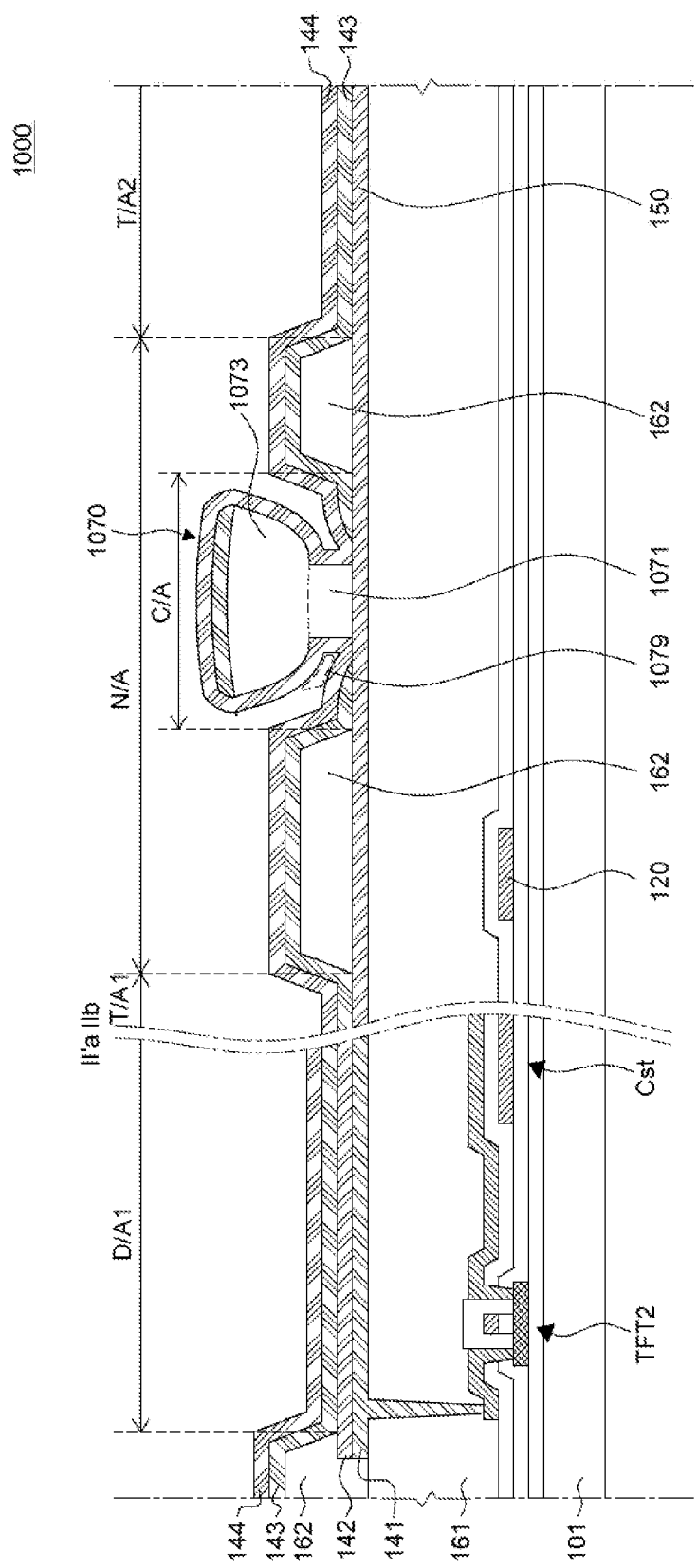
FIG. 10 is a schematic cross-sectional view provided to describe an organic light emitting display device according to still another exemplary embodiment of the present disclosure.

FIG. 10 is a schematic cross-sectional view provided to describe an organic light emitting display device according to still another exemplary embodiment of the present disclosure. An organic light emitting display device 1000 illustrated in FIG. 10 is substantially the same as the organic light emitting display device illustrated in FIG. 2 except a shape and a configuration of a partition wall 1070. Therefore, redundant descriptions thereof will be omitted.

Referring to FIG. 10, the partition wall 1070 is disposed on the transparent auxiliary electrode 150. The partition wall 1070 disposed on the transparent auxiliary electrode 150 includes a column part 1071 and a roof part 1073. The column part 1071 is a lower part of the partition wall 1070 that is in contact with the top surface of the transparent auxiliary electrode 150. The roof part 1073 is an upper part of the of the partition wall 1070 and connected with an upper portion of the column part 1071. Referring to FIG. 10, the column part 1071 and the roof part 1073 of the partition wall 1070 are integrated as one body.

Herein, the partition wall 1070 is formed of photoresist which is an insulation material. To be specific, the partition wall 1070 may be formed of negative photoresist. That is, the column part 1071 and the roof part 1073 of the partition wall 1070 may be all formed of negative photoresist.

Herein, the negative photoresist is disposed on the overall surface of the organic light emitting display panel so as to cover all of the transparent anode 142, the transparent auxiliary electrode 150, and the bank 162. The negative photoresist may be disposed by various methods. To be more specific, the negative photoresist may be disposed by spin-coating so as to cover all of the transparent anode 142, the transparent auxiliary electrode 150, and the bank 162.

Then, the negative photoresist is exposed using a mask disposed on the negative photoresist, and ultraviolet (UV) rays are irradiated above the mask through an opening of the mask. Therefore, the negative photoresist is changed in properties by the UV rays and thus may not react with a developing solution.

Then, the negative photoresist is developed. Only the developed portion of the negative photoresist is disposed on the transparent auxiliary electrode 150. In this case, the negative photoresist developed according to the properties of the negative photoresist has a reverse-taper shape.

Then, the negative photoresist is cured at a temperature equal to or higher than a critical temperature of the negative photoresist, so that the partition wall 1070 is formed. Generally, the critical temperature of the negative photoresist is about 100° C., and the negative photoresist may lose its original properties at the critical temperature or higher. To be more specific, a molding temperature of the partition wall 1070 is equal to or higher than the critical temperature of the negative photoresist. For example, the molding temperature of the partition wall 1070 may be 100° C. to 150° C. Therefore, if the developed negative photoresist is cured at the molding temperature of the partition wall 1070 in the range of 100° C. to 150° C., a shape of the developed negative photoresist may be changed. The developed negative photoresist has flowability, and a shape of the developed negative photoresist is changed from an upper part due to the reverse-taper shape of the developed negative photoresist. Further, a side portion of the upper part of the developed negative photoresist may flow down by gravity. The column part 1071 of the partition wall 1070 may have a reverse-taper shape, and the roof part 1073 of the partition wall 1070 may have a curved top surface.

Further, while the negative photoresist is developed and cured, a collapse part (recess) 1079 may be formed at a lower portion of the partition wall 1070. To be specific, the collapse part 1079 is a region of the partition wall 1070 collapsed from the outside toward the column part 1071, and the partition wall 1070 may have various shapes depending on a degree of collapse. Due to the collapse part 1079, as a lower portion of the roof part 1073 is away from the column part 1071, the lower portion of the roof part 1073 may be protruded toward the transparent auxiliary electrode 150. Also, as the lower portion of the roof part 1073 is close to the column part 1071, the lower portion of the roof part 1073 may be depressed. Therefore, the partition wall 1070 may have an umbrella shape, an overhang shape, a mushroom shape, or an eaves shape. Herein, a top surface of the roof part 1073 may include a curved surface rather than a flat surface, and a cross section of the column part 1071 may have a reverse-taper shape.

The partition wall 1070 is formed so as to minimize an area where the organic light emitting layer 143 is disposed on the transparent auxiliary electrode 150. That is, the area where the organic light emitting layer 143 is disposed on the transparent auxiliary electrode 150 may vary depending on a shape of the partition wall 1070.

Referring to FIG. 10, a contact area between a bottom surface of the column part 1071 and the top surface of the transparent auxiliary electrode 150 is smaller than an area of the top surface of the transparent auxiliary electrode 150. The lower portion of the roof part 1073 covers an upper portion of the transparent auxiliary electrode 150. Further, both side portions of the roof part 1073 are protruded toward the transparent auxiliary electrode 150, and a space between a side surface of the roof part 1073 of the partition wall 1070 and an inclined surface of the bank 162 is narrowed by the protruded roof part 1073. Therefore, it is difficult for a material constituting the organic light emitting layer 143 to be incident into the space between the side surface of the roof part 1073 of the partition wall 1070 and the inclined surface of the bank 162. Further, it is difficult to dispose the organic light emitting layer 143 on the transparent auxiliary electrode 150. Therefore, in each pixel of the transparent organic light display device including a plurality of pixels, the area where the organic light emitting layer 143 is disposed on the transparent auxiliary electrode 150 can be further equalized.

In the organic light emitting display device 1000 according to still another exemplary embodiment of the present disclosure, since the collapse part 1079 is formed at the lower portion of the partition wall 1070, the organic light emitting layer 143 is not disposed on the transparent auxiliary electrode 150. To be more specific, the partition wall 1070 having an umbrella shape due to the recess part 1079 reduces a space between the bank 162 and the partition wall 1070. That is, the partition wall 1070 having an umbrella shape due to the recess part 1079 minimizes a space into which the material constituting the organic light emitting layer 143 can be incident. Therefore, the possibility of disposing the organic light emitting layer 143 on the transparent auxiliary electrode 150 under the partition wall 1070 can be extremely lowered, and a contact area between the transparent auxiliary electrode 150 and the transparent cathode 144 can be equalized.

Figure 11:
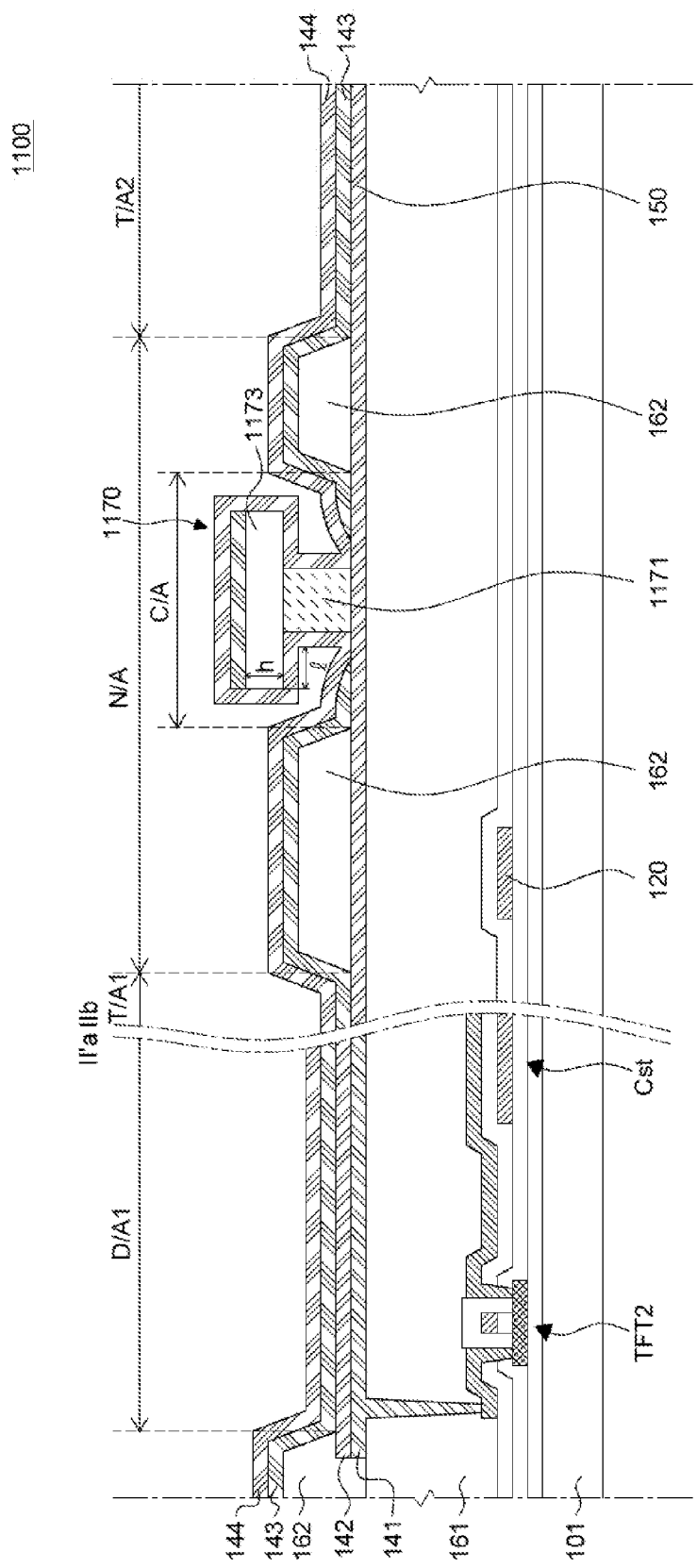
FIG. 11 is a schematic cross-sectional view provided to describe an organic light emitting display device according to still another exemplary embodiment of the present disclosure.

FIG. 11 is a schematic cross-sectional view provided to describe an organic light emitting display device according to still another exemplary embodiment of the present disclosure. An organic light emitting display device 1100 illustrated in FIG. 11 is substantially the same as the organic light emitting display device 1000 illustrated in FIG. 10 except a shape and a configuration of a partition wall 1170. Therefore, redundant descriptions thereof will be omitted.

Since a material constituting a column part 1171 and a material constituting a roof part 173 are different from each other, a reaction rate of the material constituting the column part 1171 with respect to a developing solution may be different from a reaction rate of the material constituting the roof part 1173 with respect to the developing solution. Therefore, the column part 1171 may be formed of a non-photosensitive resist having a high development rate and the roof part 1173 may be formed of a positive photoresist having a low development rate, so that roof part 1173 may completely cover the column part 1171 and partially cover an upper portion of the transparent auxiliary electrode 150.

Herein, the non-photosensitive resist may be disposed by spin-coating. For example, the non-photosensitive resist may be coated by spin-coating at a rate of 250 rpm (revolution per minute). Further, the positive photoresist may be disposed so as to have smaller thickness than the non-photosensitive resist. The positive photoresist may also be disposed by spin-coating. For example, the positive photoresist may be coated by spin-coating at a rate of 300 to 350 rpm.

Then, UV rays are irradiated onto the positive photoresist through an opening of a mask, and UV rays passing through the opening of the mask are irradiated to the positive photoresist and the non-photosensitive resist. The positive photoresist and the non-photosensitive resist are developed.

Then, the positive photoresist in a region to which UV rays are not irradiated is not removed by the developing solution, and the positive photoresist in a region to which UV rays are irradiated is removed by the developing solution. The non-photosensitive resist can be easily removed by the developing solution. Therefore, a remaining part of the developed positive photoresist becomes the roof part 1173 of the partition wall 1170, and a remaining part of the non-photosensitive resist becomes the column part 1171 of the partition wall 1170.

Herein, a rate (hereinafter, referred to as "development rate") at which the non-photosensitive resist is developed by the developing solution is higher than a development rate of the positive photoresist in the region where UV rays are irradiated. Further, since the non-photosensitive resist can be easily removed by the developing solution, the non-photosensitive resist is rapidly removed by the developing solution in a region where the positive photoresist is removed.

In the organic light emitting display device 1100 according to still another exemplary embodiment of the present disclosure, since the partition wall 1170 includes the column part 1171 and the roof part 1173, the organic light emitting layer 143 is not disposed on the transparent auxiliary electrode 150. To be specific, since the material constituting the column part 1171 and the material constituting the roof part 1173 are different from each other, a reaction rate of the material constituting the column part 1171 with respect to the developing solution is different from a reaction rate of the material constituting the roof part 1173 with respect to the developing solution. Therefore, the column part 1171 may be formed of a non-photosensitive resist having a high development rate. Also, the roof part 1173 may be formed of a positive photoresist having a low development rate, so that roof part 1173 may completely cover the column part 1171 and partially cover the upper portion of the transparent auxiliary electrode 150. Therefore, the covering area of the organic light emitting layer 143 on the transparent auxiliary electrode 150 under the partition wall 1170 can be minimized. Further, the contact area between the transparent cathode 144 and the transparent auxiliary electrode 150 under the partition wall 1170 can be equalized regardless of a position of the organic light emitting display panel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A see-through organic light emitting display device comprising:
   a light emitting region including a transparent anode, an organic light emitting layer, and a transparent cathode; and
   a see-through region including a transparent auxiliary electrode configured to transmit external light,
   wherein the transparent auxiliary electrode includes a same material as the transparent anode and the transparent auxiliary electrode is separated from the transparent anode and the transparent auxiliary electrode is configured to cover a majority of the see-through region, and
   wherein the transparent cathode extends into the see-through region to electrically connect with the transparent auxiliary electrode.

2. The see-through organic light emitting display device according to claim 1, wherein the transparent anode, the transparent cathode, and the transparent auxiliary electrode are formed of a transparent conductive oxide, and
   the transparent cathode is formed of a different material than the transparent anode and the transparent auxiliary electrode.

3. The see-through organic light emitting display device according to claim 2, wherein the transparent cathode is formed of a material configured to generate fewer foreign substances when compared to the transparent anode and the transparent auxiliary electrode.

4. The see-through organic light emitting display device according to claim 3, further comprising:
   a transparent encapsulation layer including at least a first inorganic encapsulation layer, an organic layer, and a second inorganic encapsulation layer,
   wherein the transparent encapsulation layer is disposed on the transparent cathode and covers the light emitting region and the see-through region, and wherein the transparent encapsulation layer is configured to cover the light emitting region while allowing the see-through organic light emitting display device to be flexible.

5. The see-through organic light emitting display device according to claim 1, further comprising:
a partition wall disposed on the transparent auxiliary electrode,
wherein the organic light emitting layer covers the see-through region, and the transparent cathode is formed of a material having a higher step coverage than the organic light emitting layer, and the transparent cathode is electrically connected with the transparent auxiliary electrode.

6. The see-through organic light emitting display device according to claim 1, further comprising:
a dielectric layer disposed under the transparent auxiliary electrode and the transparent anode; and
a bottom transparent auxiliary electrode disposed under the dielectric layer,
wherein the bottom transparent auxiliary electrode is electrically connected with the transparent auxiliary electrode through a contact hole formed in the dielectric layer, and
an area of the bottom transparent auxiliary electrode is greater than an area of the transparent auxiliary electrode.

7. The see-through organic light emitting display device according to claim 6, wherein at least a portion of the bottom transparent auxiliary electrode is overlapped with the transparent anode, and
the bottom transparent auxiliary electrode is electrically insulated from the transparent anode by the dielectric layer.

8. The see-through organic light emitting display device according to claim 1, further comprising:
a dielectric layer disposed under the transparent auxiliary electrode and the transparent anode; and
an opaque auxiliary electrode disposed on the dielectric layer and electrically connected with transparent auxiliary electrode,
wherein the opaque auxiliary electrode is disposed between the light emitting region and an adjacent light emitting region that is adjacent to the light emitting region.

9. The see-through organic light emitting display device according to claim 8, further comprising:
a data line arranged in the light emitting region,
wherein the data line and the opaque auxiliary electrode cross each other.

10. The see-through organic light emitting display device according to claim 1, further comprising:
a plurality of the see-through regions; and
a plurality of the light emitting regions;
wherein the plurality of the see-through regions are disposed between adjacent light emitting regions of the plurality of the light emitting regions in an alternating manner.

11. A see-through organic light emitting display device comprising:
a light emitting region including a reflection layer, a transparent anode, an organic light emitting layer, and a transparent cathode; and
a see-through region including a transparent auxiliary electrode configured to pass external light through the see-through region, wherein the transparent auxiliary electrode is configured to cover a majority of the see-through region,
wherein the reflection layer is configured to reflect light emitted from the organic light emitting layer through the transparent cathode, and
wherein the transparent cathode covers the light emitting region and the see-through region, and the transparent cathode is electrically connected with the transparent auxiliary electrode.

12. The see-through organic light emitting display device according to claim 11, further comprising:
a translucent cathode composed of a metallic material and disposed between the light emitting region and an adjacent light emitting region,
wherein a work function of the translucent cathode is lower than a work function of the transparent cathode.

13. The see-through organic light emitting display device according to claim 12, wherein the translucent cathode has a first thickness and a second thickness,
the first thickness is smaller than the second thickness,
a first portion of the translucent cathode having the first thickness is disposed in the light emitting region, and
a second portion the translucent cathode having the second thickness is disposed between the light emitting region and the adjacent light emitting region.

14. The see-through organic light emitting display device according to claim 13, wherein the second thickness is twice as thick as the first thickness,
a transmissivity of a region corresponding to the first thickness is higher than a transmissivity of a region corresponding to the second thickness, and
a resistance of the region corresponding to the second thickness is lower than a resistance of the region corresponding to the first thickness.

15. The see-through organic light emitting display device according to claim 12, wherein the translucent cathode is disposed between the organic light emitting layer and the transparent cathode.

16. The see-through organic light emitting display device according to claim 12, wherein the translucent cathode and the transparent auxiliary electrode are parallel to each other, and
the translucent cathode covers a majority of the light emitting region.

17. The see-through organic light emitting display device according to claim 13, wherein the translucent cathode and the transparent auxiliary electrode are separated from each other and electrically connected with each other by the transparent cathode.

18. A see-through apparatus comprising:
a light emitting region including a transparent anode, an organic light emitting layer, and a transparent cathode; and
a see-through region including a first transparent auxiliary electrode configured to transmit external light,
wherein the transparent cathode extends into the see-through region and is electrically connected with the transparent auxiliary electrode, and
wherein the first transparent auxiliary electrode covers at least half of the see-through region.

19. The see-through apparatus according to claim 18, further comprising:
a second transparent auxiliary electrode disposed under the first transparent auxiliary electrode,
wherein the first transparent auxiliary electrode is electrically connected with the second transparent auxiliary electrode, and wherein an area of the second transparent auxiliary electrode is greater than an area of the first transparent auxiliary electrode.

20. The see-through apparatus according to claim 19, wherein at least a portion of the second transparent auxiliary electrode is overlapped with the transparent anode.

* * * * *